(12) United States Patent
Ito et al.

(10) Patent No.: US 11,832,461 B2
(45) Date of Patent: Nov. 28, 2023

(54) PHOTOELECTRIC CONVERSION MODULE, ELECTRONIC DEVICE, AND POWER SUPPLY MODULE

(71) Applicants: Takaya Ito, Shizuoka (JP); Ryota Arai, Shizuoka (JP); Tomoya Hirano, Shizuoka (JP)

(72) Inventors: Takaya Ito, Shizuoka (JP); Ryota Arai, Shizuoka (JP); Tomoya Hirano, Shizuoka (JP)

(73) Assignee: RICOH COMPANY, LTD., Tokyo (JP)

(*) Notice: Subject to any disclaimer, the term of this patent is extended or adjusted under 35 U.S.C. 154(b) by 0 days.

(21) Appl. No.: 17/533,115

(22) Filed: Nov. 23, 2021

(65) Prior Publication Data

US 2022/0173165 A1 Jun. 2, 2022

(30) Foreign Application Priority Data

Nov. 27, 2020 (JP) .................... 2020-196552

(51) Int. Cl.
*H10K 39/10* (2023.01)
*H10K 30/81* (2023.01)
*H10K 85/60* (2023.01)

(52) U.S. Cl.
CPC ............ *H10K 39/10* (2023.02); *H10K 30/81* (2023.02); *H10K 85/655* (2023.02); *H10K 85/656* (2023.02); *H10K 85/6576* (2023.02)

(58) Field of Classification Search
CPC ........ H01K 39/10; H01K 39/12; H01K 30/81; H01K 85/655; H01K 85/656; H01K 85/6576
See application file for complete search history.

(56) References Cited

U.S. PATENT DOCUMENTS

2012/0174973 A1* 7/2012 Kwon .................. H01L 31/046
257/E31.124
2013/0037099 A1* 2/2013 Lee .................. H01L 31/03928
257/E31.124
(Continued)

FOREIGN PATENT DOCUMENTS

CN 108565303 A * 9/2018 ............. H01L 21/76
JP 2011-100923 5/2011
(Continued)

OTHER PUBLICATIONS

Office Action dated Sep. 7, 2021 in Japanese Patent Application No. 2020-196552, 3 pages.

(Continued)

*Primary Examiner* — Golam Mowla
(74) *Attorney, Agent, or Firm* — XSENSUS LLP

(57) ABSTRACT

A photoelectric conversion module includes photoelectric conversion elements electrically coupled. The photoelectric conversion elements each sequentially include first electrode, photoelectric conversion layer, and second electrode. The photoelectric conversion module includes first photoelectric conversion element, second photoelectric conversion element, coupling portion to couple the first and second photoelectric conversion elements in series, first partition portion, and second partition portion. The first electrode or the second electrode forming the first photoelectric conversion element includes a contact region in contact with the coupling portion. A value of X/(Y−X) is 0.3 or greater, where X denotes a length of the contact region and Y denotes a predetermined length in the coupling direction around the contact region.

12 Claims, 8 Drawing Sheets

(56) References Cited

U.S. PATENT DOCUMENTS

| | | | |
|---|---|---|---|
| 2015/0158814 A1 | 6/2015 | Yanagawa et al. | |
| 2015/0280142 A1 | 10/2015 | Arai et al. | |
| 2016/0155574 A1 | 6/2016 | Ishikawa et al. | |
| 2016/0260912 A1 | 9/2016 | Arai et al. | |
| 2017/0092433 A1 | 3/2017 | Kanei et al. | |
| 2017/0098721 A1* | 4/2017 | Lim | H01L 31/0465 |
| 2017/0222150 A1 | 8/2017 | Ryota et al. | |
| 2017/0243698 A1 | 8/2017 | Kanei et al. | |
| 2017/0338424 A1 | 11/2017 | Arai et al. | |
| 2020/0303133 A1 | 9/2020 | Kanei et al. | |
| 2020/0303572 A1 | 9/2020 | Zhao et al. | |
| 2021/0043846 A1 | 2/2021 | Arai et al. | |
| 2021/0296603 A1 | 9/2021 | Arai et al. | |

FOREIGN PATENT DOCUMENTS

| | | | | |
|---|---|---|---|---|
| JP | 2012-033678 A | 2/2012 | | |
| JP | 2014-064000 | 4/2014 | | |
| JP | 2014-220333 | 11/2014 | | |
| JP | 2017-152510 A | 8/2017 | | |
| JP | 2018-152486 A | 9/2018 | | |
| JP | 2018-157102 | 10/2018 | | |
| JP | 2020-025068 A | 2/2020 | | |
| JP | 2020-508559 A | 3/2020 | | |
| JP | 2021-118190 | 8/2021 | | |
| WO | WO-2010114294 A2 * | 10/2010 | ..... H01L 31/022441 | |
| WO | WO-2015001984 A1 * | 1/2015 | ........... C09B 23/005 | |
| WO | 2020/022883 A1 | 1/2020 | | |
| WO | 2020/059023 A1 | 3/2020 | | |

OTHER PUBLICATIONS

Extended European Search Report dated May 3, 2022, in corresponding European Patent Application 21209501.2.

Harrison K. H. Lee, et al., "Is organic photovoltaics promising for indoor applications?" Applied Physics Letters, 108(25), 253301(5pages), Jan. 2016.

Shigehiko Mori, et al., "Investigation of the organic solar cell characteristics for indoor LED light applications" Japanese Journal of Applied Physics 54, 071602 (2015), Regular Paper, p. 071602-1~p. 071602-6.

Office Action dated Feb. 8, 2022 in Japanese Patent Application No. 2020-196552, 2 pages.

* cited by examiner

PHOTOELECTRIC CONVERSION MODULE, ELECTRONIC DEVICE, AND POWER SUPPLY MODULE

CROSS-REFERENCE TO RELATED APPLICATIONS

This patent application is based on and claims priority pursuant to 35 U.S.C. § 119(a) to Japanese Patent Application No. 2020-196552, filed on Nov. 27, 2020, in the Japan Patent Office, the entire disclosure of which is hereby incorporated by reference herein.

BACKGROUND

Technical Field

The present disclosure relates to a photoelectric conversion module, an electronic device, and a power supply module.

Description of the Related Art

In recent years, achievement of Internet of Things (IoT) society, in which everything is connected to the Internet to enable comprehensive control, has been expected. To achieve such an IoT society, a large number of sensors are required to be coupled to various things to obtain data, but power supplies that drive such a large number of sensors are needed. Wiring to the various sensors and use of storage cells are impractical, and power supply achieved by an environmental power generation element is expected because of an increase in a social need for reducing environmental load.

Among others, photoelectric conversion elements have been attracting attention as elements that can generate electricity anywhere if light is available. In particular, flexible photoelectric conversion elements have been expected to be highly efficient and also be applicable to, for example, wearable devices by virtue of their followability to variously curved surfaces.

SUMMARY

According to one aspect of the present disclosure, a photoelectric conversion module includes a plurality of photoelectric conversion elements that are electrically coupled to each other. Each of the photoelectric conversion elements sequentially includes a first electrode, a photoelectric conversion layer, and a second electrode. The plurality of photoelectric conversion elements includes a first photoelectric conversion element and a second photoelectric conversion element. The photoelectric conversion module further includes a coupling portion configured to couple the first photoelectric conversion element and the second photoelectric conversion element in series, a first partition portion between the first electrode forming the first photoelectric conversion element and the first electrode forming the second photoelectric conversion element, and a second partition portion between the second electrode forming the first photoelectric conversion element and the second electrode forming the second photoelectric conversion element. The first electrode or the second electrode forming the first photoelectric conversion element includes a contact region which is in contact with the coupling portion. A value of X/(Y−X) is 0.3 or greater, where X denotes a length of the contact region in a coupling direction in which the first photoelectric conversion element and the second photoelectric conversion element are coupled to each other, and Y denotes a length in the coupling direction between an end of the first partition portion at a side of the second partition portion and an end of the second partition portion at a side of the first partition portion.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1:
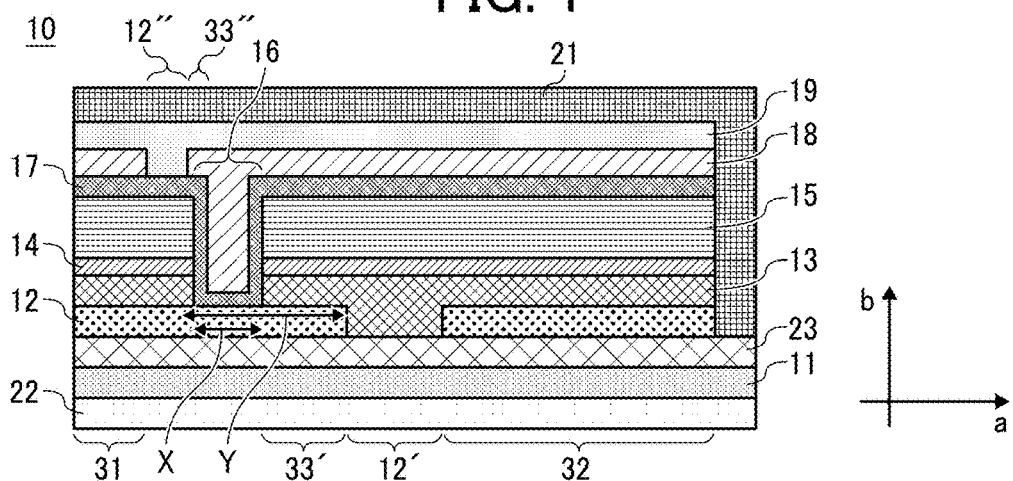
FIG. 1 is a schematic cross-sectional view illustrating one example of a photoelectric conversion module including a plurality of photoelectric conversion elements that are coupled in series.

The accompanying drawings are intended to depict embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

A photoelectric conversion element in a typical organic thin film solar cell has a structure including a first electrode, an electron transporting layer, a photoelectric conversion layer, a hole transporting layer, and a second electrode that are stacked in this order on or above a base serving as a support substrate. To increase the output of this photoelectric conversion element, a module structure may be used where a plurality of photoelectric conversion elements are produced on the same substrate and are coupled in series. In some cases, a through hole for coupling the second electrode, which is the uppermost layer of the photoelectric conversion element, to the first electrode of the adjacent photoelectric conversion element is provided, and a coupling portion is formed in the through hole. When the second electrode is coupled to the first electrode via the through hole, the second electrode is extended so as to come into contact with the first electrode for coupling to the first electrode.

However, in the photoelectric conversion module including a plurality of photoelectric conversion elements that are electrically coupled to each other, problematically, a difference in photoelectric conversion efficiency arises between in low-illuminance environments and in high-illuminance environments due to reverse current generated in the reverse direction to the current direction upon irradiation with light, in part of the electrode near the coupling portion that couples the photoelectric conversion elements in series.

The present disclosure can provide a photoelectric conversion module that can reduce the difference in photoelectric conversion efficiency between in low-illuminance environments and in high-illuminance environments is small.

Embodiments of the present disclosure will be described below.

First, the photoelectric conversion element of the photoelectric conversion module of the present disclosure will be described, and then the photoelectric conversion module will be described.

<<Photoelectric Conversion Element>>

A "photoelectric conversion element" refers to an element that converts light energy to electric energy or an element that converts electric energy to light energy. Specifically, the photoelectric conversion element is, for example, an element forming a solar cell, a photodiode, etc.

The photoelectric conversion element sequentially includes a first electrode, a photoelectric conversion layer, and a second electrode. The term "sequentially" means that these electrodes and the layer are arranged in the order mentioned above as a whole, and any other layers may be inserted between each of the electrodes and the layer. The photoelectric conversion element including the other layers that are inserted therebetween is, for example, a photoelectric conversion element sequentially including the first electrode, an electron transporting layer, the photoelectric conversion layer, a hole transporting layer, and the second electrode. In this case, moreover, other additional layers may be inserted between each of the electrodes and the layer or between the layers. Also, the term "sequentially" means that these electrodes and layers may be stacked in order from the side of the first electrode or these electrodes and layers may be stacked in order from the side of the second electrode.

Specifically, as observed from the side of the light incident surface, the photoelectric conversion element may be such that the first electrode, the photoelectric conversion layer, and the second electrode are stacked in the order mentioned, or may be such that the second electrode, the photoelectric conversion layer, and the first electrode are stacked in the order mentioned. When the photoelectric conversion element includes an electron transporting layer and a hole transporting layer, as observed from the side of the light incident surface, the photoelectric conversion element may be such that the first electrode, the electron transporting layer, the photoelectric conversion layer, the hole transporting layer, and the second electrode are stacked in the order mentioned, or may be such that the second electrode, the hole transporting layer, the photoelectric conversion layer, the electron transporting layer, and the first electrode in the order mentioned. In the present disclosure, description will be mainly made for the photoelectric conversion element where the first electrode, the electron transporting layer, the photoelectric conversion layer, the hole transporting layer, and the second electrode are stacked in the order mentioned, as observed from the side of the light incident surface. However, the present photoelectric conversion element is not limited to this configuration. Persons skilled in the art could easily understand other configurations from the below-given description, such as a photoelectric conversion element where the second electrode, the hole transporting layer, the photoelectric conversion layer, the electron transporting layer, and the first electrode are stacked in the order mentioned, as observed from the side of the light incident surface.

If necessary, the photoelectric conversion element includes, for example, a base, a surface protection layer, a sealing member, and a UV cut layer.

When the photoelectric conversion element includes a base, a preferable configuration of the photoelectric conversion element as observed from the side of the light incident surface is: a configuration where the base, the first electrode, the electron transporting layer, the photoelectric conversion layer, the hole transporting layer, and the second electrode are stacked in the order mentioned; or a configuration where the base, the second electrode, the hole transporting layer, the photoelectric conversion layer, the electron transporting layer, and the first electrode are stacked in the order mentioned.

<Base>

The "base" is a member configured to support, for example, the electrodes and the layers that form the photoelectric conversion element. From the viewpoint of increasing photoelectric conversion efficiency, the base is preferably high in light transmittivity and more preferably transparent. From the viewpoint of broadening applications of the photoelectric conversion element, the base is preferably high in flexibility.

Examples of the material of the base having transparency and flexibility include, but are not limited to: resin films of, for example, polyesters such as polyethylene terephthalate, polycarbonates, polyimides, polymethyl methacrylates, polysulfones, and polyether ether ketone; and glass thin films having an average thickness of 200 μm or less. Of these materials, from the viewpoints of easiness to produce and of cost, resin films of polyesters and polyimides, and glass thin films are preferable.

Examples of the material of the base having transparency but having no flexibility include, but are not limited to, inorganic transparent crystals such as glass. These materials are preferable because they have no flexibility but have high flatness.

When the resin film is used as the material of the base, the resin film preferably has gas barrier property. The gas barrier property is the function of suppressing transmission of water vapor and oxygen. As the resin film having gas barrier property, a known resin film may be appropriately used. Examples thereof include, but are not limited to, aluminum-coated resin films.

<First Electrode>

The "first electrode" is an electrode configured to collect electrons generated through photoelectric conversion. When the first electrode is provided on the light incident surface side, the first electrode is preferably high in light transmission and more preferably transparent from the viewpoint of increasing photoelectric conversion efficiency. When the first electrode is provided on the opposite side to the light incident surface, light transmission and transparency may be low.

As the first electrode having transparency, a transparent electrode may be used that is an electrode transparent to visible light. The transparent electrode is, for example, a structure including a transparent conductive film, a metal thin film, and a transparent conductive film that are sequentially stacked. The two transparent conductive films, which sandwich the metal thin film, may be formed of the same material or of different materials.

Examples of the material of the transparent conductive film include, but are not limited to, tin-doped indium oxide (ITO), zinc-doped indium oxide (IZO), zinc oxide (ZnO), fluorine-doped tin oxide (FTO), aluminum-doped zinc oxide (AZO), gallium-doped zinc oxide (GZO), tin oxide ($SnO_2$), silver nanowires, and nanocarbons (e.g., carbon nanotubes and graphene). Of these materials, preferable are tin-doped indium oxide (ITO), zinc-doped indium oxide (IZO), and aluminum-doped zinc oxide (AZO).

Examples of the material of the metal thin film include, but are not limited to, metals such as aluminum, copper, silver, gold, platinum, and nickel.

The first electrode having transparency is preferably integrated in use with the above base from the viewpoint of maintaining rigidity. Examples of such integrated products include, but are not limited to, FTO-coated glass, ITO-coated glass, aluminum-coated glass, FTO-coated transparent plastic films, ITO-coated transparent plastic films, and ITO/Ag/ITO stacked coat plastic films.

Examples of the material of the first electrode having no transparency include, but are not limited to, metals such as platinum, gold, silver, copper, and aluminum, and graphite.

The average thickness of the first electrode is preferably 5 nm or greater but 10 μm or less and more preferably 50 nm or greater but 1 μm or less.

The sheet resistance of the first electrode is preferably 50 Ω/sq. or lower, more preferably 30 Ω/sq. or lower, and further preferably 20 Ω/sq. or lower.

When the first electrode has transparency, the light transmittance of the first electrode is preferably 60% or higher, more preferably 70% or higher, further preferably 80% or higher, and particularly preferably 90% or higher. The upper limit of the light transmittance is not particularly limited and may be appropriately selected depending on the intended purpose.

The first electrode can be formed through wet film formation, dry film formation such as vapor deposition or sputtering, or printing.

<Electron Transporting Layer>

The "electron transporting layer" is a layer configured to transport electrons generated in the photoelectric conversion layer and suppress entry of holes generated in the photoelectric conversion layer. In the configuration, one electron transporting layer may be present or two or more electron transporting layers may be present. As one example, the following is described about the configuration including two electron transporting layers. Specifically, this is a configuration including a first electron transporting layer and a second electron transporting layer (which may also be referred to as an "intermediate layer") that is provided between the first electron transporting layer and the photoelectric conversion layer. When the intended configuration includes one electron transporting layer, the one electron transporting layer is preferably the same layer as the first electron transporting layer.

—First Electron Transporting Layer—

The first electron transporting layer is preferably a layer containing particles of a metal oxide.

Examples of the metal oxide include, but are not limited to: oxides of, for example, titanium, zinc, lithium, and tin; and ITO, FTO, ATO, AZO, and GZO. Of these, zinc oxide is preferable, and in order to increase conductivity, a doped zinc oxide is more preferable. Examples of the doped zinc oxide include, but are not limited to, aluminum-doped zinc oxide, gallium-doped zinc oxide, and lithium-doped zinc oxide. The metal oxide for use may be a metal oxide formed of, for example, an alkoxide of a metal serving as a raw material.

The average particle diameter of the particles of the metal oxide is preferably 1 nm or more but 50 nm or less and more preferably 5 nm or more but 20 nm or less.

The average particle diameter of the particles of the metal oxide is calculated by measuring 100 or more randomly selected metal oxide particles for particle diameter in the following manner, for example, and by determining the average of the measurements obtained. First, a dispersion liquid containing the particles of the metal oxide is transferred to a nebulizer made of glass using a micropipette. Next, the dispersion liquid is sprayed from the nebulizer to a grid for a TEM and with a collodion film. Using PVD, the grid is allowed to undergo carbon vapor deposition. Under an electron microscope, an image of the particles of the metal oxide is obtained. The obtained image is subjected to image processing to measure the particle diameters of the particles of the metal oxide. Alternatively, the cross-section of the photoelectric conversion element may be observed under a scanning transmission electron microscope (TEM) to perform particle recognition through image processing, to thereby measure the particle diameters of the particles of the metal oxide. Also, the particle size distribution may be measured by, for example, a laser diffraction and scattering method. Known methods can be employed for a method of exposing the cross-section of the photoelectric conversion element, observation under a TEM, and measurement of the particle size distribution.

The average thickness of the first electron transporting layer is preferably 1 nm or greater but 300 nm or less and more preferably 10 nm or greater but 150 nm or less.

An exemplary method for forming the first electron transporting layer is a method of applying a dispersion liquid containing the particles of the metal oxide and a dispersion medium, followed by drying. Examples of the dispersion medium include, but are not limited to, alcohols such as methanol, ethanol, isopropanol, 1-propanol, 2-methoxyethanol, and 2-ethoxyethanol, and mixtures thereof.

—Second Electron Transporting Layer (Intermediate Layer)—

The second electron transporting layer is preferably a layer containing an amine compound. The amine compound is not particularly limited as long as it is a material that can increase photoelectric conversion efficiency of the photoelectric conversion element as a result of formation of the second electron transporting layer. For example, an amine compound represented by General Formula (4) below is preferably used.

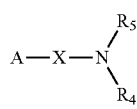

General Formula (4)

In the above General Formula (4), $R_4$ and $R_5$ independently represent an alkyl group which may have a substituent and contains carbon atoms of 1 or more but 4 or less, or represent a ring structure where $R_4$ and $R_5$ are bonded to each other. Preferably, $R_4$ and $R_5$ independently represent an alkyl group which may have a substituent and contains carbon atoms of 1 or more but 4 or less. More preferably, $R_4$ and $R_5$ independently represent an alkyl group which has no substituent and contains carbon atoms of 1 or more but 4 or less. Examples of the substituent include, but are not limited to, a methyl group, an ethyl group, and a hydroxyl group. The number of carbon atoms in the above ring structure is preferably 3 or more but 6 or less. When $R_4$ and $R_5$ independently represent an alkyl group which may have a substituent and contains carbon atoms of 1 or more but 4 or less, the alkyl group represented by $R_4$ and the alkyl group represented by $R_5$ may be identical to or different from each other.

In the above General Formula (4), X represents a divalent aromatic group having carbon atoms of 6 or more but 14 or less or an alkyl group having carbon atoms of 1 or more but 4 or less. X is preferably a divalent aromatic group having carbon atoms of 6 or more but 14 or less.

In the above General Formula (4), A represents a substituent of Structural Formula (1), (2), or (3). A is preferably a substituent of Structural Formula (1).

—COOH             Structural Formula (1)

—P(=O)(OH)$_2$        Structural Formula (2)

—Si(OH)$_3$            Structural Formula (3)

Examples of the amine compound other than those represented by the above General Formula (4) include, but are not limited to, 3-aminopropyltriethoxysilane, 3-aminopropyltriethoxysilane, 3-aminopropyldiethoxymethylsilane, 3-(2-aminoethylamino)propyltriethoxysilane, 3-(2-aminoethylamino)propyldimethoxymethylsilane, 3-(2-aminoethylamino)propyltriethoxysilane, trimethoxy[3-(phenylamino)propyl]silane, trimethoxy[3-(methylamino)propyl]silane, bis[3-(trimethoxysilyl)propyl]amine, bis[3-(triethoxysilyl)propyl]amine, and N,N'-bis[3-(trimethoxysilyl)propyl]ethane-1,2-diamine.

An exemplary method for forming the second electron transporting layer is a method of applying a solution containing the amine compound through, for example, spin coating or dipping, followed by drying.

<Photoelectric Conversion Layer>

The "photoelectric conversion layer" is a layer configured to absorb light to generate electrons and holes. The photoelectric conversion layer contains two or more kinds of organic materials. Specifically, the photoelectric conversion layer contains an electron-donating organic material (which may also be referred to as a p-type organic semiconductor material) and an electron-accepting organic material (which may also be referred to as a n-type organic semiconductor material). The electron-donating organic material and the electron-accepting organic material may each use two or more kinds of organic materials. It is preferable that the photoelectric conversion layer contain three or more kinds of organic materials. Also, in the photoelectric conversion layer, the electron-donating organic material and the electron-accepting organic material are preferably mixed to form a bulk heterostructure.

—Electron-Donating Organic Material—

The electron-donating organic material is preferably a π-electron conjugated compound having a highest occupied molecular orbital (HOMO) level of 4.8 eV or higher but 5.7 eV or lower and more preferably a π-electron conjugated compound having a HOMO level of 5.1 eV or higher but 5.5 eV or lower or a π-electron conjugated compound having a HOMO level of 5.2 eV or higher but 5.6 eV or lower.

The highest occupied molecular orbital (HOMO) level can be measured through, for example, photoelectron spectroscopy or cyclic voltammetry. Specifically, it can be measured using a device such as AC-3 available from RIKEN KEIKI CO., LTD.

Examples of the electron-donating organic material include, but are not limited to: conjugated polymers coupled with various aromatic derivatives (e.g., thiophene, fluorene, carbazole, thienothiophene, benzodithiophene, dithienosilole, quinoxaline, and benzothiadiazole); and porphyrins and phthalocyanines which are low-molecular-weight conjugated compounds. The electron-donating organic material may be a donor-acceptor linked material having an electron-donating moiety and an electron-accepting moiety in a molecule thereof.

The number average molecular weight (Mn) of the electron-donating organic material is preferably 10,000 or lower and more preferably 5,000 or lower when the electron-donating organic material is a low-molecular-weight material. It is preferably 10,000 or higher when the electron-donating organic material is a polymer.

One preferable example of the electron-donating organic material is an organic material having a highest occupied molecular orbital (HOMO) level of 5.1 eV or higher but 5.5 eV or lower and a number average molecular weight (Mn) of 10,000 or lower. Such an organic material is, for example, a compound represented by General Formula (1) below.

General Formula (1)

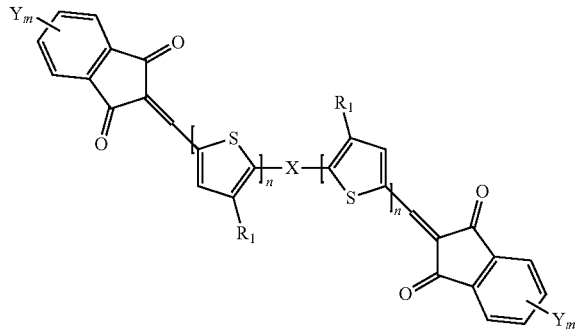

In the above General Formula (1), $R_1$ represents an alkyl group having carbon atoms of 2 or more but 8 or less.

In the above General Formula (1), n represents an integer of 1 or greater but 3 or smaller.

In the above General Formula (1), Y represents a halogen atom.

In the above General Formula (1), m represents an integer of 0 or greater but 4 or smaller.

In the above General Formula (1), X represents General Formula (2) below or General Formula (3) below.

General Formula (2)

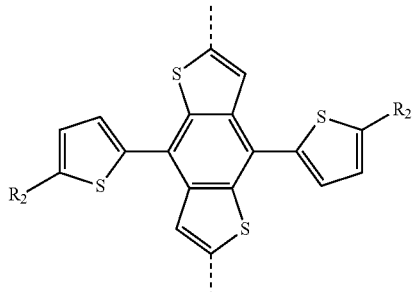

General Formula (3)

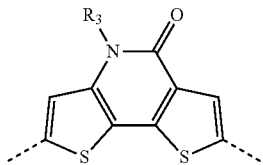

In the above General Formula (2), $R_2$ represents a straight-chain or branched alkyl group and is preferably a straight-chain or branched alkyl group having carbon atoms of 2 or more but 30 or less.

In the above General Formula (3), $R_3$ represents a straight-chain or branched alkyl group and is preferably a straight-chain or branched alkyl group having carbon atoms of 2 or more but 30 or less.

Another preferable example of the electron-donating organic material is an organic material having a highest occupied molecular orbital (HOMO) level of 5.2 eV or higher but 5.6 eV or lower and a number average molecular weight (Mn) of 10,000 or higher. This organic material is preferably used in combination with the above organic material having a highest occupied molecular orbital (HOMO) level of 5.1 eV or higher but 5.5 eV or lower and a number average molecular weight (Mn) of 10,000 or lower.

Examples of the organic material having a highest occupied molecular orbital (HOMO) level of 5.2 eV or higher but 5.6 eV or lower and a number average molecular weight (Mn) of 10,000 or higher include, but are not limited to, 2,1,3-benzothiadiazole-thiophene-based copolymers, quinoxaline-thiophene-based copolymers, thiophene-benzodithiophene-based copolymers, and polyfluorene-based polymers.

The 2,1,3-benzothiadiazole-thiophene-based copolymer is a conjugated copolymer having, in a main chain, a thiophene backbone and a 2,1,3-benzothiadiazole backbone. Specific examples of the 2,1,3-benzothiadiazole-thiophene-based copolymer include, but are not limited to, those represented by General Formulae (5) to (8) below. In the General Formulae (5) to (8) below, n each independently represents an integer of 1 or greater but 1,000 or smaller.

General Formula (5)

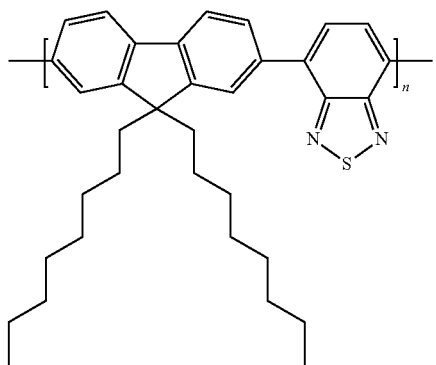

General Formula (6)

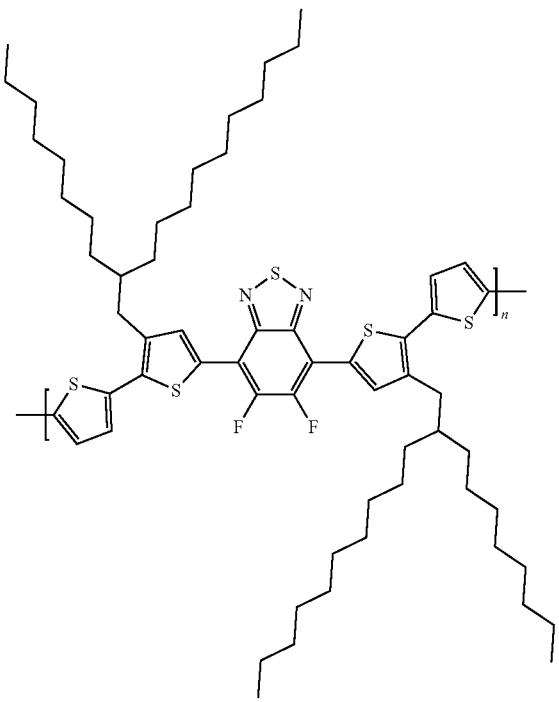

General Formula (7)

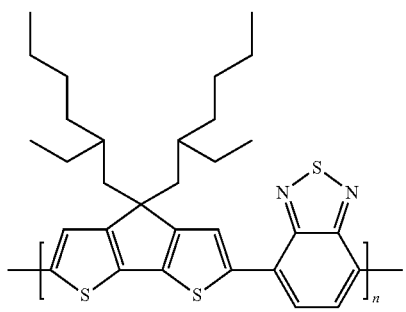

General Formula (8)

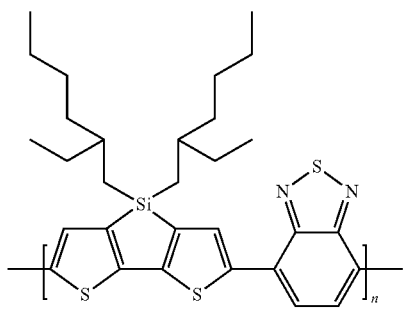

The quinoxaline-thiophene-based copolymer is a conjugated copolymer having, in a main chain, a thiophene backbone and a quinoxaline backbone. Specific examples of the quinoxaline-thiophene-based copolymer include, but are not limited to, those represented by General Formula (9) below. In the General Formula (9) below, n represents an integer of 1 or greater but 1,000 or smaller.

General Formula (9)

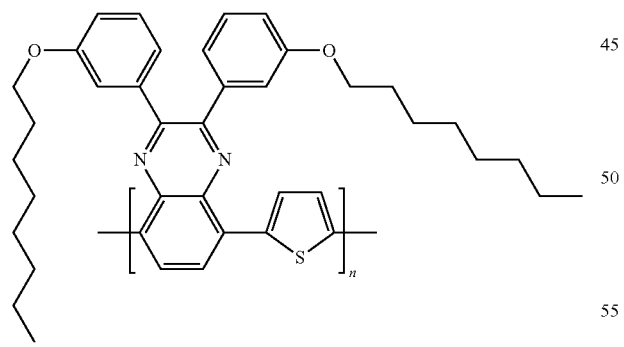

The thiophene-benzodithiophene-based copolymer is a conjugated copolymer having, in a main chain, a thiophene backbone and a benzodithiophene backbone. Specific examples of the thiophene-benzodithiophene-based copolymer include, but are not limited to, those represented by General Formulae (10) to (13) below. In the General Formulae (10) to (13) below, n each independently represents an integer of 1 or greater but 1,000 or smaller.

General Formula (10)

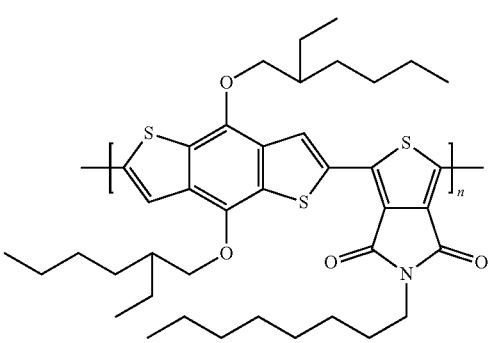

General Formula (11)

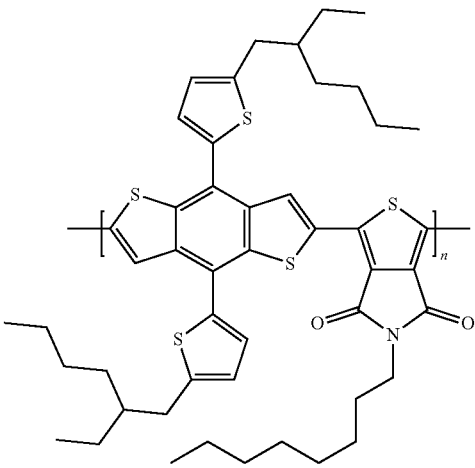

General Formula (12)

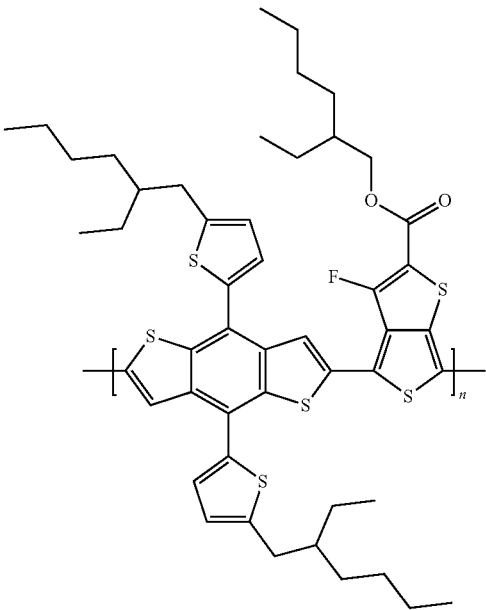

-continued

General Formula (13)

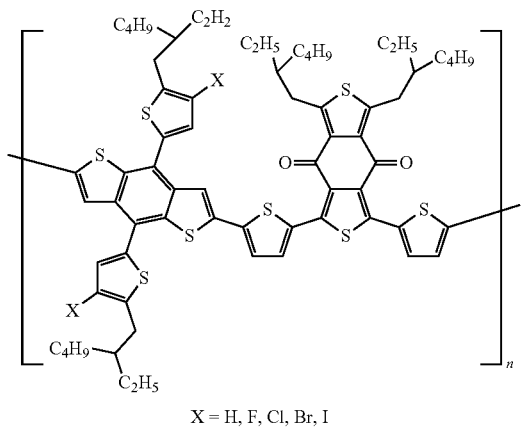

X = H, F, Cl, Br, I

—Electron-Accepting Organic Material—

The electron-accepting organic material is preferably a π-electron conjugated compound having a lowest unoccupied molecular orbital (LUMO) level of 3.5 eV or higher but 4.5 eV or lower.

Examples of the electron-accepting organic material include, but are not limited to, fullerenes or derivatives thereof, naphthalene tetracarboxylic acid imide derivatives, and perylene tetracarboxylic acid imide derivatives. Of these, fullerene derivatives are preferable.

Examples of the fullerene derivatives include, but are not limited to, $C_{60}$, phenyl-$C_{61}$-methyl butyrate (fullerene derivatives described as PCBM, [60]PCBM, or $PC_{61}BM$ in, for example, some publicly known documents), $C_{70}$, phenyl-$C_{71}$-methyl butyrate (fullerene derivatives described as PCBM, [70]PCBM, or $PC_{71}BM$ in, for example, some publicly known documents), and fulleropyrrolidine-based fullerene derivatives represented by General Formula (14) below. The fulleropyrrolidine-based fullerene derivatives represented by General Formula (14) below are preferable.

General Formula (14)

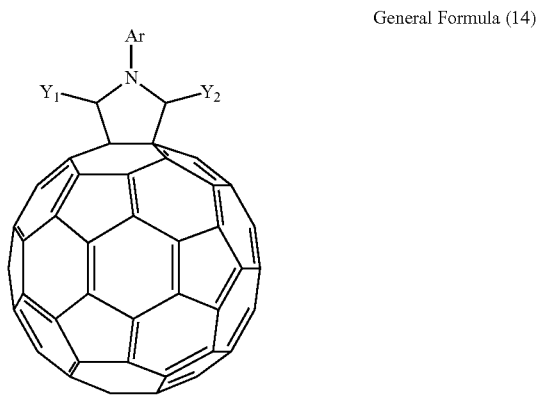

In the above General Formula (14), $Y_1$ and $Y_2$ each independently represent a hydrogen atom, an alkyl group, an alkenyl group, an alkynyl group, an aryl group, or an aralkyl group, provided that $Y_1$ and $Y_2$ are not a hydrogen atom at the same time. The alkyl group, the alkenyl group, the alkynyl group, the aryl group, or the aralkyl group may have or may not have a substituent.

The alkyl group represented by $Y_1$ and $Y_2$ is preferably an alkyl group having carbon atoms of 1 or more but 22 or less, more preferably an alkyl group having carbon atoms of 1 or more but 12 or less, and further preferably an alkyl group having carbon atoms of 6 or more but 12 or less. These alkyl groups may be straight-chain or branched but are preferably straight-chain. The alkyl group may further contain one or more heteroatoms such as S and O in the carbon chain thereof.

The alkenyl group represented by $Y_1$ and $Y_2$ is preferably an alkenyl group having carbon atoms of 2 or more but 10 or less. More preferable specific examples thereof include, but are not limited to, straight-chain or branched alkenyl groups having carbon atoms of 2 or more but 4 or less, such as a vinyl group, a 1-propenyl group, an allyl group, an isopropenyl group, a 1-betene group, a 2-butenyl group, a 3-butenyl group, a 1-methyl-2-propenyl group, and a 1,3-butadienyl group.

The alkynyl group represented by $Y_1$ and $Y_2$ is preferably an alkynyl group having carbon atoms of 1 or more but 10 or less. More preferable specific examples thereof include, but are not limited to, straight-chain or branched alkynyl groups having carbon atoms of 2 or more but 4 or less, such as an ethynyl group, a 1-propynyl group, a 2-propenyl group, a 1-methyl-2-propynyl group, a 1-butynyl group, a 2-butynyl group, and a 3-butynyl group.

Examples of the aryl group represented by $Y_1$ and $Y_2$ include, but are not limited to, a phenyl group, a naphthyl group, an anthranyl group, and a phenanthryl group.

Examples of the aralkyl group represented by $Y_1$ and $Y_2$ include, but are not limited to, aralkyl groups having carbon atoms of 7 or more but 20 or less, such as 2-phenylethyl, benzyl, 1-phenylethyl, 3-phenylpropyl, and 4-phenylbutyl.

When the alkyl group, the alkenyl group, the alkynyl group, the aryl group, or the aralkyl group represented by $Y_1$ and $Y_2$ has a substituent, specific examples of the substituent include, but are not limited to, an alkyl group, an alkoxycarbonyl group, a polyether group, an alkanoyl group, an amino group, an aminocarbonyl group, an alkoxy group, an alkylthio group, group: —CONHCOR' (where R' is an alkyl group), group: —C(=NR')—R" (where R' and R" are an alkyl group), and group: —NR'=CR"R'" (where R', R", and R'" are an alkyl group).

Of the substituents represented by $Y_1$ and $Y_2$, the polyether group exemplified is a group represented by, for example, formula: $Y_3$—$(OY_4)_n$—O—. In this formula, $Y_3$ is a monovalent hydrocarbon group such as an alkyl group and $Y_4$ is a divalent aliphatic hydrocarbon group. In the polyether group represented by the above formula, specific examples of the repeating unit —$(OY_4)_n$— include, but are not limited to, alkoxy chains such as —$(OCH_2)_n$—, —$(OC_2H_4)_n$—, and —$(OC_3H_6)_n$—. The number n of the repeating units is preferably 1 or greater but 20 or smaller and more preferably 1 or greater but 5 or smaller. The repeating unit represented by —$(OY_4)_n$— may contain not only the same repeating units but also two or more kinds of different repeating units. Of the above repeating units, —$OC_2H_4$— and —$OC_3H_6$— may be straight-chain or branched.

In the substituents represented by $Y_1$ and $Y_2$, the alkyl group and an alkyl group moiety in the alkoxycarbonyl group, the alkanoyl group, the alkoxy group, the alkylthio group, the polyether group, the group: —CONHCOR', the group: —C(=NR')—R", and the group: —NR'=CR"R'" are preferably an alkyl group having carbon atoms of 1 or more but 22 or less, more preferably an alkyl group having carbon atoms of 1 or more but 12 or less, and further preferably an alkyl group having carbon atoms of 6 or more but 12 or less.

In the substituents represented by $Y_1$ and $Y_2$, the amino group and an amino group moiety in the aminocarbonyl group are preferably amino groups to which one or more alkyl groups each having carbon atoms of 1 or more but 20 or less are bonded.

In the above General Formula (16), Ar represents an aryl group, provided that the aryl group may have or may not have a substituent.

Examples of the aryl group represented by Ar include, but are not limited to, a phenyl group, a naphthyl group, an anthranyl group, a phenanthryl group. Of these, a phenyl group is preferable.

When the aryl group represented by Ar has a substituent, specific examples of the substituent include, but are not limited to, aryl groups, alkyl groups, a cyano group, alkoxy groups, and alkoxycarbonyl groups. Examples of the aryl groups as the substituent include, but are not limited to, a phenyl group. The alkyl group and an alkyl group moiety in the alkoxy group in these substituents are preferably an alkyl group having carbon atoms of 1 or more but 22 or less. The number and positions of these substituents are not particularly limited. For example, 1 or more but 3 or less substituents can be present at any positions.

—Average Thickness of the Photoelectric Conversion Layer—

The average thickness of the photoelectric conversion layer is preferably 50 nm or more but 400 nm or less and more preferably 60 nm or more but 250 nm or less. When the average thickness thereof is 50 nm or more, a sufficient number of carriers are generated by the photoelectric conversion layer through light absorption. When the average thickness thereof is 400 nm or less, reduction in transportation efficiency of carriers generated through light absorption is suppressed.

The average thickness of the photoelectric conversion layer is calculated by measuring the thickness of the photoelectric conversion layer at 9 randomly selected points in the following manner, for example, and by determining the average of the measurements obtained. First, a liquid containing materials forming the photoelectric conversion layer is applied on a substrate and dried, and then a solvent is used to wipe off the resultant at any points. Using DEKTAK available from Bruker Corporation, the heights of the level differences at the wiped sites, and the average value of the obtained measurements is defined as the average thickness. Alternatively, the cross-section of the photoelectric conversion element may be observed under a scanning electron microscope (SEM) or a transmission electron microscope (TEM) to measure the average thickness of the photoelectric conversion layer.

—Method for Forming a Bulk Heterojunction in the Photoelectric Conversion Layer—

The photoelectric conversion layer may be formed by sequentially stacking layers of the above organic materials as a layer having a planar junction interface. In order to enlarge the area of the junction interface, preferably, the above organic materials are three-dimensionally mixed to form a bulk heterojunction. The bulk heterojunction is formed in the following manner, for example.

When the organic materials have high solubility, the bulk heterojunction is formed by dissolving the organic materials in a solvent to prepare a solution where the organic materials are mixed at a molecular level, and by applying the solution and then drying to remove the solvent. In this case, a heating treatment may further be performed to optimize the aggregated state of the organic materials.

When the organic materials have low solubility, the bulk heterojunction is formed by dissolving one of the organic materials to prepare a solution and dispersing another one of the organic materials in the solution to prepare a liquid, and by applying the liquid and then drying to remove the solvent. In this case, a heating treatment may further be performed to optimize the aggregated state of the organic materials.

—Method for Forming the Photoelectric Conversion Layer—

A method for forming the photoelectric conversion layer includes a step of applying the liquid containing the above organic materials. Examples of a method of applying the liquid include, but are not limited to, spin coating, blade coating, slit die coating, screen printing coating, bar coater coating, mold coating, print transfer, dipping and pulling, inkjet, spraying, and vacuum vapor deposition. An actually used method can be appropriately selected therefrom depending on the properties of a photoelectric conversion layer intended to be produced; i.e., in consideration of, for example, thickness control and orientation control.

For spin coating, for example, it is preferable to use a solution containing the organic materials at a concentration of 5 mg/mL or more but 40 mg/mL or less. Here, the concentration refers to the total mass of the organic materials relative to the volume of the solution containing the organic materials. In the above range of concentration, it is possible to easily form a homogeneous photoelectric conversion layer.

In order to remove the solvent or dispersion medium from the applied liquid containing the organic materials, an annealing treatment may be performed under reduced pressure or in an inert atmosphere (in a nitrogen or argon atmosphere). The temperature of the annealing treatment is preferably 40° C. or higher but 300° C. or lower and more preferably 50° C. or higher but 150° C. or lower. Performing the annealing treatment is preferable because the materials forming the layers can permeate each other at the interface between the stacked layers to have an increased contact area, which may be able to increase the short circuit current.

Examples of the solvent or dispersion medium for dissolving or dispersing the organic materials include, but are not limited to, methanol, ethanol, butanol, toluene, xylene, o-chlorophenol, acetone, ethyl acetate, ethylene glycol, tetrahydrofuran, dichloromethane, chloroform, dichloroethane, chlorobenzene, dichlorobenzene, trichlorobenzene, ortho-dichlorobenzene, chloronaphthalene, dimethylformamide, dimethyl sulfoxide, N-methylpyrrolidone, and γ-butyrolactone. These may be used alone or in combination. Of these, chlorobenzene, chloroform, and ortho-dichlorobenzene are particularly preferable.

Various additives may be contained in the above solvent or dispersion medium. Examples of the various additives for use include, but are not limited to, diiodooctane and octanedithiol.

<Hole Transporting Layer>

The "hole transporting layer" is a layer configured to transport holes generated in the photoelectric conversion layer and suppress entry of electrons generated in the photoelectric conversion layer. In the configuration, one hole transporting layer may be present or two or more hole transporting layers may be present. As one example, the following is described about the configuration including one hole transporting layer.

The hole transporting layer is preferably a layer containing at least one selected from the group consisting of organic compounds having hole transportability and inorganic compounds having hole transportability. Examples of the organic compounds having hole transportability include, but are not limited to: conductive polymers such as polyethylenedioxythiophene:polystyrene sulfonic acid (PEDOT:PSS); and aromatic amine derivatives. Examples of the inorganic compounds having hole transportability include, but are not limited to, molybdenum oxide, tungsten oxide, vanadium oxide, nickel oxide, and copper(I) oxide. Of these compounds having hole transportability, molybdenum oxide, tungsten oxide, and vanadium oxide are preferable.

The average thickness of the hole transporting layer is preferably 200 nm or less and more preferably 1 nm or more but 50 nm or less.

Examples of a method for forming the hole transporting layer include, but are not limited to, a method of applying and then drying a liquid containing the compound having hole transportability and a solvent or dispersion medium. Examples of a method of applying the liquid include, but are not limited to, spin coating, the sol-gel method, slit die coating, and sputtering.

<Second Electrode>

The "second electrode" is an electrode configured to collect holes generated through photoelectric conversion. When the second electrode is provided on the light incident surface side, the second electrode is preferably high in light transmission and more preferably transparent from the viewpoint of increasing photoelectric conversion efficiency. When the second electrode is provided on the opposite side to the light incident surface, light transmission and transparency may be low.

The second electrode may be the same electrode as the above first electrode, and description therefor will be omitted.

<Surface Protection Layer (Passivation Layer)>

The "surface protection layer" is a layer configured to prevent direct contact between the sealing member and the electrode provided on the opposite side to the light incident surface. The surface protection layer may be a member provided so as to prevent direct contact between the sealing member and an exposed surface of each of the layers stacked, in addition to the electrode provided on the opposite side to the light incident surface. The surface protection layer may also be referred to as a passivation layer.

Examples of the material of the surface protection layer include: but are not limited to: metal oxides such as SiOx, SiOxNy, and $Al_2O_3$; and polymers such as polyethylene, fluorine-based coating agents, and poly-para-xylylene. These may be used alone or in combination. Of these, metal oxides are preferable.

The average thickness of the surface protection layer is preferably 1 nm or more but 10 μm or less.

Examples of a method for forming the surface protection layer include, but are not limited to, vacuum vapor deposition, sputtering, reactive sputtering, molecular beam epitaxy (MBE), plasma CVD, laser CVD, thermal CVD, gas-source CVD, coating, printing, and transferring.

<Sealing Member>

The "sealing member" is a member that is provided to cover the surface protection layer and configured to suppress entry of external substances such as water and oxygen into the photoelectric conversion element. The sealing member is preferably a gas barrier member that suppresses entry of external substances into the photoelectric conversion element, or a film member having, for example, an adhesive member that allows for adhesion to the surface protection layer. When the sealing member is provided on the opposite side to the light incident surface, the sealing member may or may not have light transmittivity or transparency.

The function required for the gas barrier member is typically represented by, for example, a water vapor transmission rate or an oxygen transmission rate. Preferably, the water vapor transmission rate per day according to the method stipulated by JIS (Japanese Industrial Standards) K7129 B is, for example, $1 \times 10^{-2}$ g/m$^2$ or lower, and the lower it is, the more preferable. Preferably, the oxygen transmission rate per day according to the method stipulated by JIS K7126-2 is, for example, 1 cm$^3$/m$^2$·atm or lower, and the lower it is, the more preferable.

The material of the adhesive member may be, for example, a typical material that is used for sealing of, for example, organic electroluminescence elements and organic transistors. Specific examples of the material of the adhesive member include, but are not limited to, pressure-sensitive adhesive resins, thermosetting resins, thermoplastic resins, and photocurable resins. Of these, pressure-sensitive adhesive resins are preferable because there is no need for heating at a sealing step. More specific examples thereof include, but are not limited to, ethylene-vinyl acetate copolymer resins, styrene-isobutyrene resins, hydrocarbon-based resins, epoxy-based resins, polyester-based resins, acrylic-based resins, urethane-based resins, and silicone-based resins. By, for example, chemical modification of the main chain, branched chains, and terminals of these resins, and adjustment of molecular weights thereof, various adhesion properties can be obtained.

<UV Cut Layer>

The "UV cut layer" is a layer that is provided on the light incident surface side and configured to suppress degradation of the photoelectric conversion element due to UV light. The UV cut layer is preferably a film member that absorbs UV light. The UV cut layer is preferably provided on the base located on the light incident surface side.

The function required for the UV cut layer is typically represented by, for example, light transmittance. Preferably, the light transmittance of light having a wavelength of 370 nm or shorter is, for example, lower than 1%. Preferably, the light transmittance of light having a wavelength of 410 nm or shorter is, for example, lower than 1%.

<Gas Barrier Layer>

The "gas barrier layer" is a layer configured to suppress entry of external substances such as water and oxygen into the photoelectric conversion element. The gas barrier layer is preferably a continuous film. The gas barrier layer is preferably provided between the base and the first electrode.

The function required for the gas barrier layer is typically represented by, for example, a water vapor transmission rate or an oxygen transmission rate. Preferably, the water vapor transmission rate per day according to the method stipulated by JIS K7129 B is, for example, $1 \times 10^{-2}$ g/m$^2$ or lower, and the lower it is, the more preferable. Preferably, the oxygen transmission rate per day according to the method stipulated by JIS K7126-2 is, for example, 1 cm$^3$/m$^2$·atm or lower, and the lower it is, the more preferable.

Examples of the material of the gas barrier layer include, but are not limited to: materials containing $SiO_2$, SiNx, $Al_2O_3$, SiC, SiCN, SiOC, and SiOAl; and siloxane-based materials.

<Other Layers>

If necessary, the photoelectric conversion element may further include other layers such as an insulating porous layer, a degradation preventing layer, and a protection layer.

<<Photoelectric Conversion Module>>

The "photoelectric conversion module" includes a plurality of photoelectric conversion elements that are electrically coupled to each other. Regarding the electrical coupling, the photoelectric conversion elements may be coupled in series or in parallel. The photoelectric conversion module may include both a plurality of photoelectric conversion elements that are electrically coupled in series and a plurality of photoelectric conversion elements that are electrically coupled in parallel. In the present disclosure, the "coupling" in each occurrence shall not be limited to a physical coupling and shall include an electrical coupling as well.

The photoelectric conversion module includes a plurality of photoelectric conversion elements and a coupling portion configured to electrically couple the plurality of photoelectric conversion elements to each other; and if necessary, includes other members. In other words, the photoelectric conversion module includes a first photoelectric conversion element, a second photoelectric conversion element, and a coupling portion configured to electrically couple the first photoelectric conversion element and the second photoelectric conversion element to each other; and if necessary, includes other members. The photoelectric conversion element and the coupling portion may be functionally distinguishable members. The photoelectric conversion element and the coupling portion may be independent members. Alternatively, the photoelectric conversion elements and the coupling portion may be a continuously or integrally provided member. For example, the electrode, as one constituting member of the photoelectric conversion element, and the coupling portion may be independent members or may be a continuously or integrally provided member.

One example of the configuration of the photoelectric conversion module will be described with reference to FIG. 1. FIG. 1 is a schematic cross-sectional view illustrating one example of a photoelectric conversion module including a plurality of photoelectric conversion elements that are coupled in series.

As illustrated in FIG. 1, a photoelectric conversion module 10 includes a first photoelectric conversion element 31, a second photoelectric conversion element 32, and a coupling portion 16.

The first photoelectric conversion element 31 and the second photoelectric conversion element 32 each have a structure where a UV cut layer 22, a base 11, a gas barrier layer 23, a first electrode 12, a first electron transporting layer 13, a second electron transporting layer (an intermediate layer) 14, a photoelectric conversion layer 15, a hole transporting layer 17, a second electrode 18, a surface protection layer (a passivation layer) 19, and a sealing member 21 are stacked in a stacking direction "b" in the order mentioned from the side of the light incident surface (hereinafter this structure may also be referred to as "Structure A"). The stacking direction "b" indicates a direction perpendicular to the surface of each of the layers of the photoelectric conversion element.

The order in which the first electrode 12 to the second electrode 18 are stacked is not limited to this order, as described above. Specifically, the first photoelectric conversion element 31 and the second photoelectric conversion element 32 may each have a structure where a UV cut layer 22, a base 11, a gas barrier layer 23, a second electrode 18, a hole transporting layer 17, a photoelectric conversion layer 15, a second electron transporting layer (an intermediate layer) 14, a first electron transporting layer 13, a first electrode 12, a surface protection layer (a passivation layer) 19, and a sealing member 21 are stacked in the stacking direction b in the order mentioned from the side of the light incident surface (hereinafter this structure may also be referred to as "Structure B"). In other words, the Structure B is different from the structure illustrated in FIG. 1 in that the first electrode 12 and the second electrode 18 are transposed and that a set of the first electron transporting layer 13 and the second electron transporting layer (the intermediate layer) 14 and the hole transporting layer 17 are transposed. In the present disclosure, description will be mainly made for the structure as illustrated in FIG. 1, where the first electrode 12 is located closer to the side of the light incident surface than the second electrode 18 (i.e., Structure A). However, persons skilled in the art could easily understand the other structure from such descriptions; i.e., the structure where the second electrode 18 is located closer to the side of the light incident surface than the first electrode 12 (i.e., Structure B).

Figure 2:
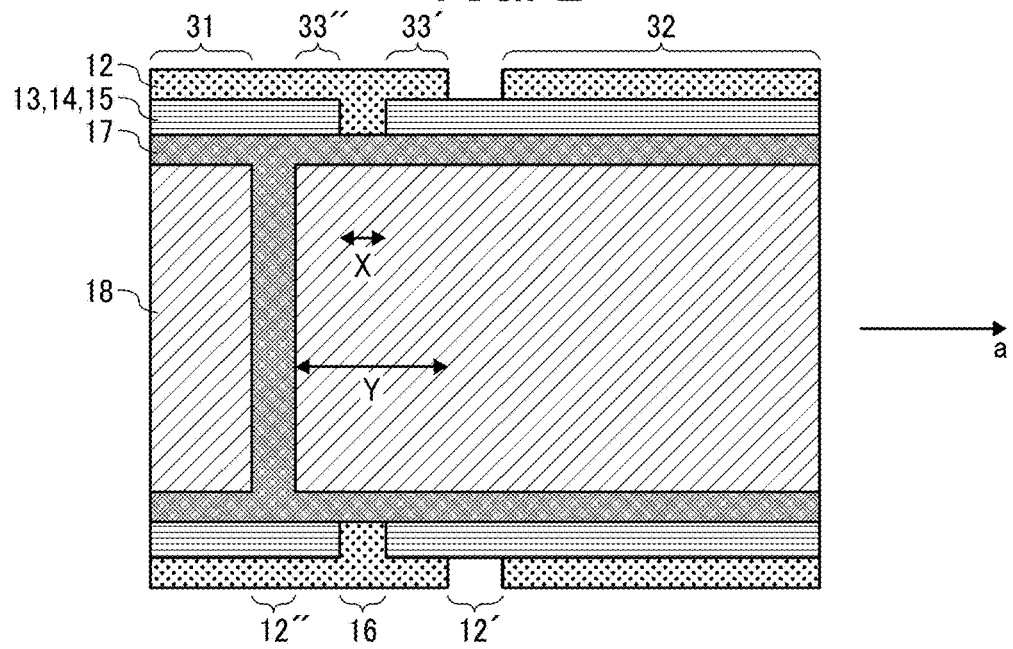
FIG. 2 is a schematic cross-sectional view illustrating one example of a partial structure of the photoelectric conversion module illustrated in FIG. 1, as viewed from a side of a second electrode 18.

The coupling portion 16 is a member configured to couple the first photoelectric conversion element 31 and the second photoelectric conversion element 32 in series in a coupling direction "a". The coupling direction "a" in the first photoelectric conversion element 31 and the second photoelectric conversion element 32 is a plane direction of the layers forming the photoelectric conversion element (e.g., the photoelectric conversion layer 15) and is a direction in which the first photoelectric conversion element 31 and the second photoelectric conversion element 32 are coupled. The coupling direction "a" is, for example, a direction indicated by the shortest straight line among the lines each connecting the end of the first photoelectric conversion element 31 with the end of the second photoelectric conversion element 32. For better understanding the coupling direction "a", FIG. 2 is given. FIG. 2 is a schematic view illustrating one example of a partial structure of the photoelectric conversion module illustrated in FIG. 1, as viewed from the side of the second electrode 18.

The coupling portion 16 has a structure where it is continuous with the second electrode 18 and the hole transporting layer 17 in the second photoelectric conversion element 32. When this structure contacts the first electrode 12 in the first photoelectric conversion element 31, the first photoelectric conversion element 31 and the second photoelectric conversion element 32 are coupled in series. In this structure, a region in contact with the coupling portion 16 in the first electrode 12 forming the first photoelectric conversion element 31 is indicated by a contact region.

When the first photoelectric conversion element 31 and the second photoelectric conversion element 32 have the Structure B, the coupling portion 16 has a structure where it is continuous with the first electrode 12, the first electron transporting layer 13, and the second electron transporting layer (the intermediate layer) 14 in the second photoelectric conversion element 32. When this structure contacts the second electrode 18 in the first photoelectric conversion element 31, the first photoelectric conversion element 31 and the second photoelectric conversion element 32 are coupled in series. In this structure, a region in contact with the coupling portion 16 in the second electrode 18 forming the first photoelectric conversion element 31 is indicated by a contact region.

The structure of the coupling portion 16 will be described. The coupling portion 16 has a penetrating structure that penetrates the layers in the photoelectric conversion element in the stacking direction "b". Specifically, the coupling portion 16 has a penetrating structure that penetrates at least the photoelectric conversion layer 15 in the stacking direction "b". More specifically, the coupling portion 16 has a penetrating structure that penetrates the photoelectric conversion layer 15, the second electron transporting layer (the intermediate layer) 14, and the first electron transporting layer 13 in the stacking direction b.

Also in the Structure B, the coupling portion 16 has a penetrating structure that penetrates the layers in the photoelectric conversion element in the stacking direction "b". Specifically, the coupling portion 16 has a penetrating structure that penetrates at least the photoelectric conversion layer 15 in the stacking direction "b". More specifically, the coupling portion 16 has a penetrating structure that penetrates the photoelectric conversion layer 15 and the hole transporting layer 17 in the stacking direction "b".

The materials forming the coupling portion 16 will be described. As described above, the coupling portion 16 has a structure where it is continuous with the second electrode 18 and the hole transporting layer 17 in the second photoelectric conversion element 32, and contains the material of the second electrode 18 and the material of the hole transporting layer 17. As illustrated in FIG. 1, the peripheral portion of the coupling portion 16 in contact with the layers and the electrodes of the photoelectric conversion element is formed of the material of the hole transporting layer 17, and the interior of the coupling portion 16 is formed of the material of the second electrode 18. Accordingly, the first electrode 12 in the first photoelectric conversion element 31 is in contact with the portion containing the material of the hole transporting layer 17 forming the coupling portion 16 (the peripheral portion). With such a structure, the interior of the coupling portion 16 formed of the material of the second electrode 18 can be coupled to the first electrode 12 in the first photoelectric conversion element 31 via the portion containing the material of the hole transporting layer 17 without contacting the photoelectric conversion layer 15, the second electron transporting layer (the intermediate layer) 14, and the first electron transporting layer 13.

In the Structure B, as described above, the coupling portion 16 has a structure where it is continuous with the first electrode 12, the first electron transporting layer 13, and the second electron transporting layer (the intermediate layer) 14 in the second photoelectric conversion element 32, and contains the material of the first electrode 12, the material of the first electron transporting layer 13, and the material of the second electron transporting layer (the intermediate layer) 14. The peripheral portion of the coupling portion 16 in contact with the layers and the electrodes of the photoelectric conversion element is formed of the material of the first electron transporting layer 13 and the material of the second electron transporting layer (the intermediate layer) 14, and the interior of the coupling portion 16 is formed of the material of the first electrode 12. Accordingly, the second electrode 18 in the first photoelectric conversion element 31 is in contact with the portion containing the material of the first electron transporting layer 13 forming the coupling portion 16 or the portion containing the material of the second electron transporting layer (the intermediate layer) 14 (the peripheral portion). With such a structure, the interior of the coupling portion 16 formed of the material of the first electrode 12 can be coupled to the second electrode 18 in the first photoelectric conversion element 31 via the portion containing the material of the first electron transporting layer 13 and the material of the second electron transporting layer (the intermediate layer) 14 without contacting the photoelectric conversion layer 15 and the hole transporting layer 17.

The peripheral region of the coupling portion 16 will be described. As illustrated in FIG. 1, a photoelectric conversion module 10 includes a first partition portion 12' between a first electrode 12 forming a first photoelectric conversion element 31 and a first electrode 12 forming a second photoelectric conversion element 32. The photoelectric conversion module 10 also includes a second partition portion 12" between a second electrode 18 forming the first photoelectric conversion element 31 and a second electrode 18 forming the second photoelectric conversion element 32. In this structure, as illustrated in FIG. 1, a value of X/(Y−X) is 0.3 or greater, where X denotes a length of the contact region in a coupling direction "a" and Y denotes a length in the coupling direction between an end of the first partition portion 12' at a side of the second partition portion and an end of the second partition portion 12" at a side of the first partition portion. The value of X/(Y−X) is preferably 0.3 or greater at all the sites in the depth direction of the cross-section illustrated in FIG. 1, but is not limiting. In other words, it is enough that the value of X/(Y−X) is 0.3 or greater at at least one site in the depth direction of the cross-section illustrated in FIG. 1. Examples of a method of adjusting the value of X/(Y−X) include, but are not limited to, appropriately adjusting a penetrating portion provided in a pre-step of forming the coupling portion. Specifically, the value of X/(Y−X) is adjustable by selecting, for example, the laser diameter and the number of scanning of a laser used for forming the penetrating portion.

The reason that the value of X/(Y−X) is adjusted to 0.3 or greater will be described. In FIG. 1, electrons collected in the first electrode 12 of the first photoelectric conversion element 31 move in the first electrode 12 toward the coupling portion 16; i.e., in the positive direction of the coupling direction "a" (hereinafter the positive direction may also be referred to as a "forward direction"). In an intermediate region 33' located between the first photoelectric conversion element 31 and the second photoelectric conversion element 32, electrons collected in the first electrode 12 move in the first electrode 12 toward the coupling portion 16; i.e., in the negative direction of the coupling direction "a" (hereinafter the negative direction may also be referred to as a "reverse direction"). Holes collected in the second electrode 18 of the second photoelectric conversion element 32 move in the second electrode 18 toward the coupling portion 16; i.e., in the negative direction of the coupling direction "a" (hereinafter the negative direction may also be referred to as a "reverse direction"). In an intermediate region 33" located between the first photoelectric conversion element 31 and the second photoelectric conversion element 32, holes collected in the second electrode 18 move in the second electrode 18 toward the coupling portion 16; i.e., in the positive direction of the coupling direction "a" (hereinafter the positive direction may also be referred to as a "forward direction"). Thus, in part of the electrode, current is generated when electrons move in the opposite direction (the reverse direction) to a direction in which electrons move upon irradiation with light (the forward direction) and holes move in the opposite direction (the forward direction) to a direction in which holes move upon irradiation with light (the reverse direction). In other words, reverse current is generated which is current generated in the opposite direction to the direction of current upon irradiation with light. This reverse current is a factor of reduction in photoelectric conversion efficiency in the photoelectric conversion module, particularly reducing the photoelectric conversion efficiency more at a low illuminance (e.g., at an illuminance of 200 lx) than at a high illuminance (e.g., at an illuminance of 10,000 lx). As a result, there is a problem with an increase in the difference in photoelectric conversion efficiency between in low-illuminance environments and in high-illuminance environments. However, when the above value of X/(Y−X) is 0.3 or greater, generation of the reverse current is suppressed, which makes it possible to increase the photoelectric conversion efficiency in the photoelectric conversion module and make small the difference in the photoelectric conversion efficiency between in low-illuminance environments and in high-illuminance environments. By this, it is possible to provide, for example, a photoelectric conversion module that can be used over a broad range of illuminance.

Also in the Structure B where the reverse current is generated similar to the Structure A, when the above value of X/(Y−X) is 0.3 or greater, generation of the reverse current is suppressed, which makes it possible to make small the difference in the photoelectric conversion efficiency between in low-illuminance environments and in high-illuminance environments.

The above length X is preferably 0.1 mm or more but 0.5 mm or less. This is because when the X is 0.1 mm or more, the function of the coupling portion (electrical coupling between the photoelectric conversion elements) is suitably exhibited, while when the X is 0.5 mm or less, it is possible to ensure a sufficient region where photoelectric conversion is possible in the photoelectric conversion module.

The X is preferably 1% or more relative to the length of the photoelectric conversion element in the coupling direction and more preferably 5% or more relative thereto. The X is preferably 20% or less relative to the length of the photoelectric conversion element in the coupling direction and more preferably 10% or less relative thereto.

The above length Y−X is preferably 0 mm or more but 0.5 mm or less. As described above, generation of the reverse current can be suppressed more when the Y−X is less, and thus the less the Y−X, the more preferable. Specifically, the Y−X is preferably 0.5 mm or less as described above. When trying to make the Y−X smaller, however, the Y−X is preferably 0 mm or more from the viewpoint of a production process. Specifically, there is a risk of breaking the other components such as a base at the time of formation of the penetrating portion provided in a pre-step of forming the coupling portion.

The Y−X is preferably 20% or less relative to the photoelectric conversion element in the coupling direction, more preferably 10% or less relative thereto, and further preferably 5% or less relative thereto.

Figure 3:
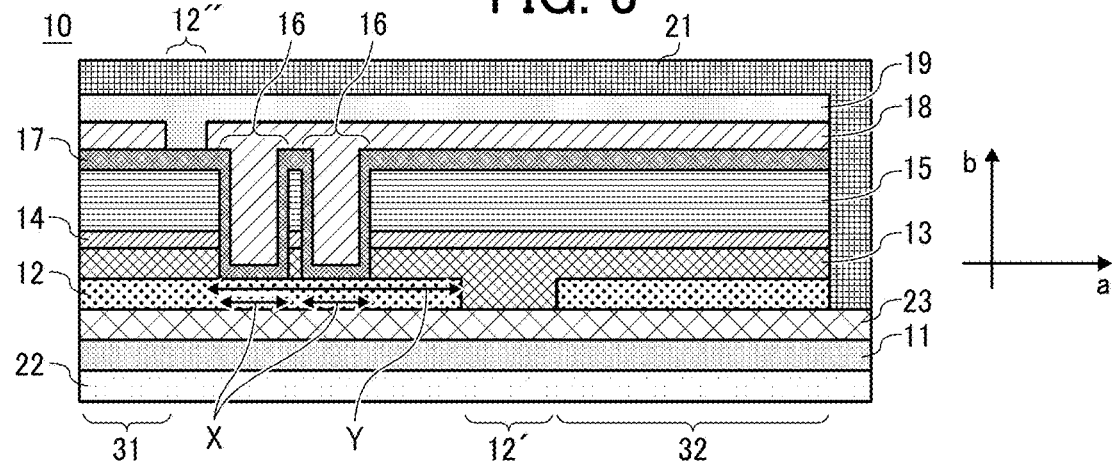
FIG. 3 is a schematic view illustrating one example of a photoelectric conversion module including two coupling portions between a first photoelectric conversion element and a second photoelectric conversion element.

The above description is made for the structure where one coupling portion is present between the first photoelectric conversion element and the second photoelectric conversion element. The number of the coupling portions between the first photoelectric conversion element and the second photoelectric conversion element may be two or more. A structure where the number of coupling portions is two or more will be described with reference to FIG. 3. FIG. 3 is a schematic view illustrating one example of the photoelectric conversion module including two coupling portions between the first photoelectric conversion element and the second photoelectric conversion element. The members forming the photoelectric conversion module illustrated in FIG. 3 are the same as the members forming the photoelectric conversion module illustrated in FIG. 1, and descriptions therefor will be omitted.

The photoelectric conversion module illustrated in FIG. 3 is the same as the photoelectric conversion module illustrated in FIG. 1 also in that the value of X/(Y−X) is 0.3 or greater. In the photoelectric conversion module illustrated in FIG. 3, which includes two or more coupling portions between the first photoelectric conversion element and the second photoelectric conversion element, the X refers to the sum of the lengths of the two or more contact regions in the coupling direction "a".

<<Method for Producing the Photoelectric Conversion Module>>

As one example of a method for producing the photoelectric conversion module, description will be made for a method for producing a photoelectric conversion module including a plurality of photoelectric conversion elements that are coupled in series. In the present disclosure, one example of a method for producing a photoelectric conversion module having the Structure A as illustrated in FIG. 1 will be described. However, persons skilled in the art could easily understand from the below-given description one example of a method for producing a photoelectric conversion module having the Structure B.

The method for producing the photoelectric conversion module includes, for example: a first electrode forming step of forming a first electrode; an electron transporting layer forming step of forming an electron transporting layer on the first electrode; a photoelectric conversion layer forming step of forming a photoelectric conversion layer on the electron transporting layer; a penetrating portion forming step of forming a penetrating portion that penetrates the electron transporting layer and the photoelectric conversion layer; a hole transporting layer forming step of forming a hole transporting layer on the photoelectric conversion layer and coating a material of the hole transporting layer on exposed surfaces of the first electrode, the electron transporting layer, and the photoelectric conversion layer in the penetrating portion; and a second electrode forming step of forming a second electrode on the hole transporting layer and filling the penetrating portion with a material of the second electrode to form a penetrating structure. If necessary, the method includes, for example, a surface protection layer forming step, a sealing member forming step, a UV cut layer forming step, a gas barrier layer forming step, and other steps.

<First Electrode Forming Step>

The method for producing the photoelectric conversion module preferably includes a first electrode forming step of forming a first electrode. The first electrode is preferably formed on a base or on a gas barrier layer formed on the base.

A method of forming the first electrode is as described in the description regarding the first electrode.

<Electron Transporting Layer Forming Step>

The method for producing the photoelectric conversion module preferably includes an electron transporting layer forming step of forming an electron transporting layer on the first electrode. When a first electron transporting layer and a second electron transporting layer (an intermediate layer) are included as the electron transporting layer, the electron transporting layer forming step preferably includes a first electron transporting layer forming step of forming the first electron transporting layer on the first electrode and a second electron transporting layer forming step of forming the second electron transporting layer on the first electron transporting layer.

A method of forming the electron transporting layer is as described in the description regarding the electron transporting layer.

<Photoelectric Conversion Layer Forming Step>

The method for producing the photoelectric conversion module preferably includes a photoelectric conversion layer forming step of forming a photoelectric conversion layer on the electron transporting layer.

A method of forming the photoelectric conversion layer is as described in the description regarding the photoelectric conversion layer.

<Penetrating Portion Forming Step>

The method for producing the photoelectric conversion module preferably includes a penetrating portion forming step of forming a penetrating portion that penetrates the electron transporting layer and the photoelectric conversion layer. In the present disclosure, the penetrating portion is a vacant pore. In the photoelectric conversion module having the Structure A as illustrated in FIG. 1, the penetrating portion is a vacant pore that penetrates the electron transporting layer and the photoelectric conversion layer. The shape, size, etc. of the penetrating portion are not limited as long as the first photoelectric conversion element and the second photoelectric conversion element can be electrically coupled to each other. Examples of the shape thereof include, but are not limited to, shapes that become a line or circle when the plan view of the photoelectric conversion module is observed from the second electrode thereof. Further examples of the shape thereof include, but are not limited to, shapes that become a rectangle or square when the cross-section of the photoelectric conversion module is observed.

Examples of a method of forming the penetrating portion include, but are not limited to, laser deletion and mechanical scribing.

<Hole Transporting Layer Forming Step>

The method for producing the photoelectric conversion module preferably includes a hole transporting layer forming step of forming a hole transporting layer on the photoelectric conversion layer and coating a material of the hole transporting layer on exposed surfaces of the first electrode, the electron transporting layer, and the photoelectric conversion layer in the penetrating portion.

A method of forming the hole transporting layer is as described in the description regarding the hole transporting layer.

<Second Electrode Forming Step>

The method for producing the photoelectric conversion module preferably includes a second electrode forming step of forming a second electrode on the hole transporting layer and filling the penetrating portion with a material of the second electrode to form a penetrating structure. In the present disclosure, the penetrating structure is a structure that fills the interior of the penetrating portion. In the photoelectric conversion module having the Structure A as illustrated in FIG. 1, the penetrating structure is a structure formed of the material of the hole transporting layer and the material of the second electrode.

A method for forming the second electrode is as described in the description regarding the second electrode.

<Surface Protection Layer Forming Step>

The method for producing the photoelectric conversion module may, if necessary, include a surface protection layer forming step of forming a surface protection layer on the electrode provided at an opposite side to the light incident surface. The surface protection layer forming step is preferably a step of forming the surface protection layer also on the exposed surfaces of the layers stacked.

<Sealing Member Forming Step>

The method for producing the photoelectric conversion module may, if necessary, include a sealing member forming step of forming a sealing member so as to cover the surface protection layer.

<UV Cut Layer Forming Step>

The method for producing the photoelectric conversion module may, if necessary, include a UV cut layer forming step of forming a UV cut layer on the light incident surface side.

<Gas Barrier Layer Forming Step>

The method for producing the photoelectric conversion module may, if necessary, include a gas barrier layer forming step of forming a gas barrier layer between the base and the first electrode.

<Other Steps>

The method for producing the photoelectric conversion module may, if necessary, include an insulating porous layer forming step, a degradation preventing layer forming step, and a protection layer forming step.

<Specific Example of the Method for Producing the Photoelectric Conversion Module>

Referring to FIG. 4A to FIG. 4M, one example of the method for producing the photoelectric conversion module will be described in detail. FIG. 4A to FIG. 4M are schematic views each illustrating the method for producing the photoelectric conversion module.

Figure 4A:
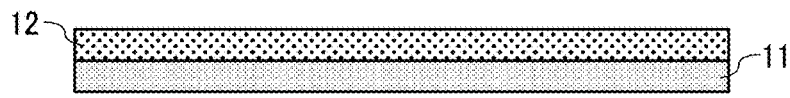
FIG. 4A is a schematic view illustrating one example of a method for producing a photoelectric conversion module.
Figure 4B:
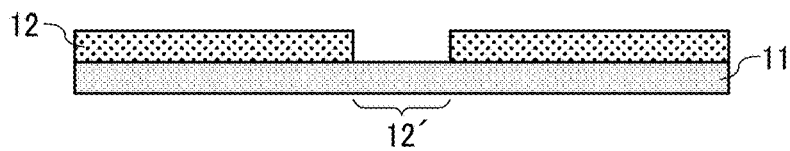
FIG. 4B is a schematic view illustrating one example of a method for producing a photoelectric conversion module.
Figure 4C:
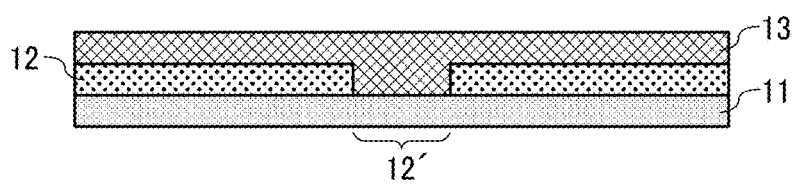
FIG. 4C is a schematic view illustrating one example of a method for producing a photoelectric conversion module.
Figure 4D:
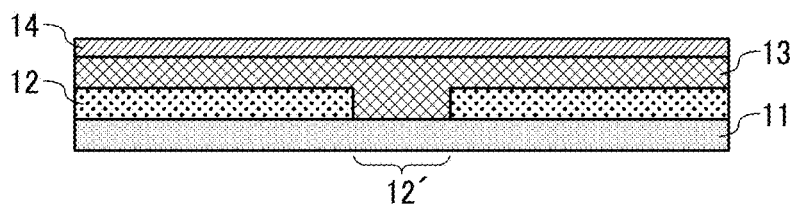
FIG. 4D is a schematic view illustrating one example of a method for producing a photoelectric conversion module.
Figure 4E:
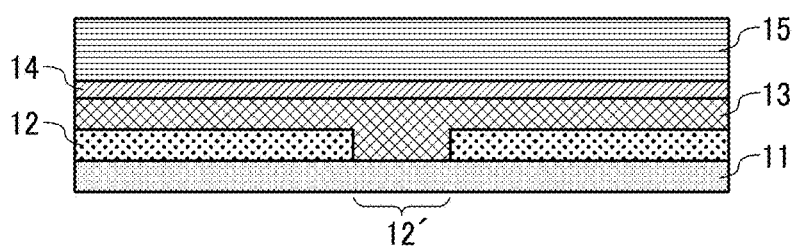
FIG. 4E is a schematic view illustrating one example of a method for producing a photoelectric conversion module.
Figure 4F:
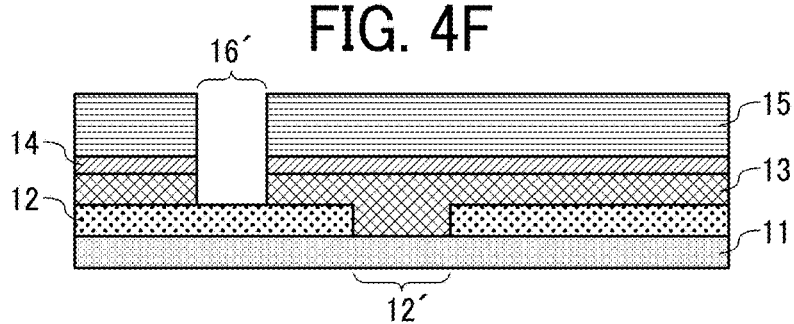
FIG. 4F is a schematic view illustrating one example of a method for producing a photoelectric conversion module.
Figure 4G:
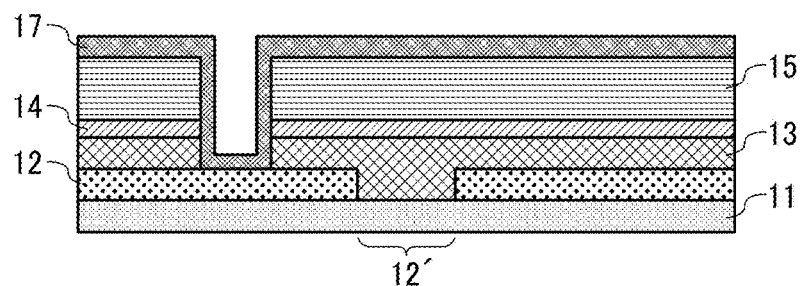
FIG. 4G is a schematic view illustrating one example of a method for producing a photoelectric conversion module.
Figure 4H:
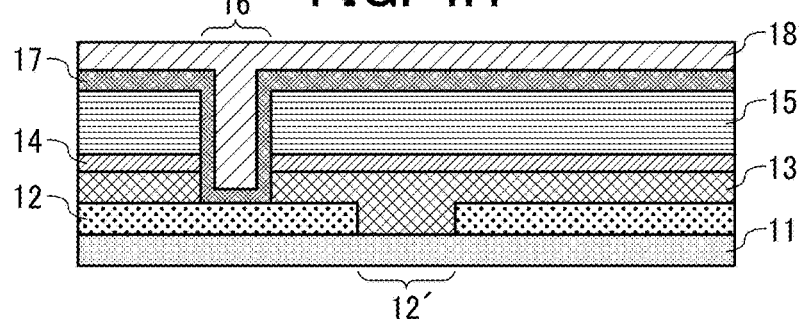
FIG. 4H is a schematic view illustrating one example of a method for producing a photoelectric conversion module.
Figure 4I:
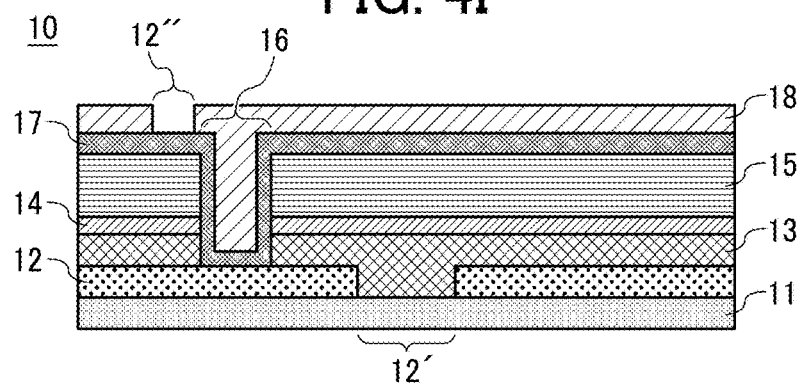
FIG. 4I is a schematic view illustrating one example of a method for producing a photoelectric conversion module.

As illustrated in FIG. 4A, first, a first electrode 12 is formed on a substrate 11. When forming a plurality of photoelectric conversion elements on one substrate 11, as illustrated in FIG. 4B, part of the formed first electrode 12 is deleted to form a first partition portion 12'. Next, as illustrated in FIG. 4C and FIG. 4D, a first electron transporting layer 13 is formed on the substrate 11 and the first electrode 12, and a second electron transporting layer (an intermediate layer) 14 is formed on the first electron transporting layer 13. Next, as illustrated in FIG. 4E, a photoelectric conversion layer 15 is formed on the formed second electron transporting layer 14. After the formation of the photoelectric conversion layer 15, as illustrated in FIG. 4F, a penetrating portion 16' is formed by removing a predetermined region so as to penetrate the first electron transporting layer 13 formed on the first electrode 12, the second electron transporting layer 14 formed on the first electron transporting layer 13, and the photoelectric conversion layer 15. After the formation of the penetrating portion 16', as illustrated in FIG. 4G and FIG. 4H, a hole transporting layer 17 and a second electrode 18 are formed. After the formation of the hole transporting layer 17 and the second electrode 18, a coupling portion 16 is formed that is a structure formed in the penetrating portion 16' of the material of the hole transporting layer and the material of the second electrode. When forming a plurality of photoelectric conversion elements on one substrate 11, as illustrated in FIG. 4I, a second partition portion 12" is formed in the second electrode 18.

Figure 4J:
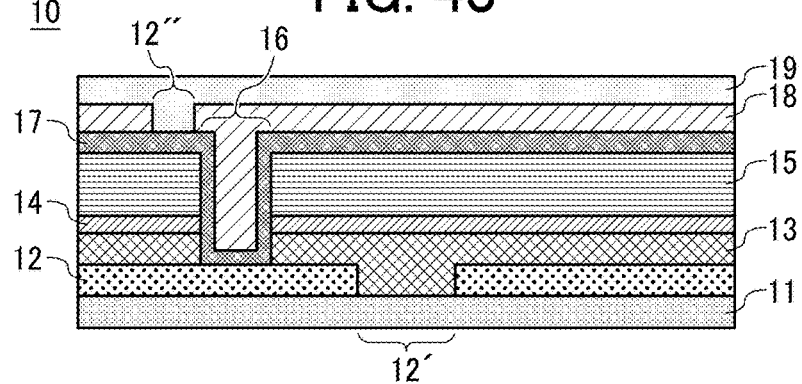
FIG. 4J is a schematic view illustrating one example of a method for producing a photoelectric conversion module.
Figure 4K:
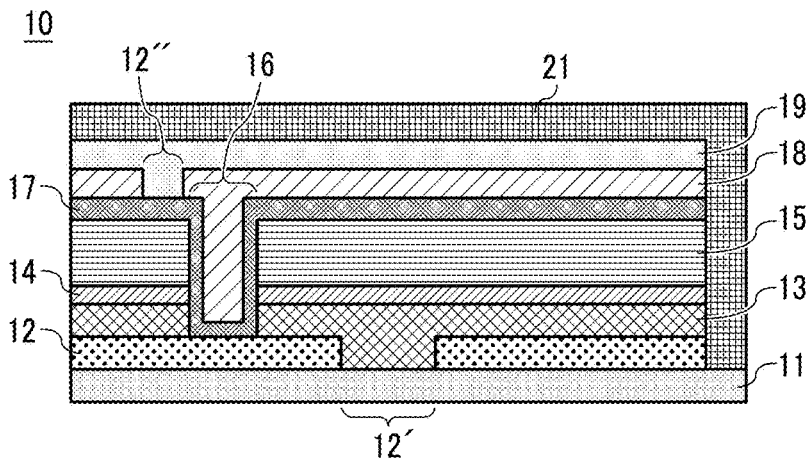
FIG. 4K is a schematic view illustrating one example of a method for producing a photoelectric conversion module.
Figure 4L:
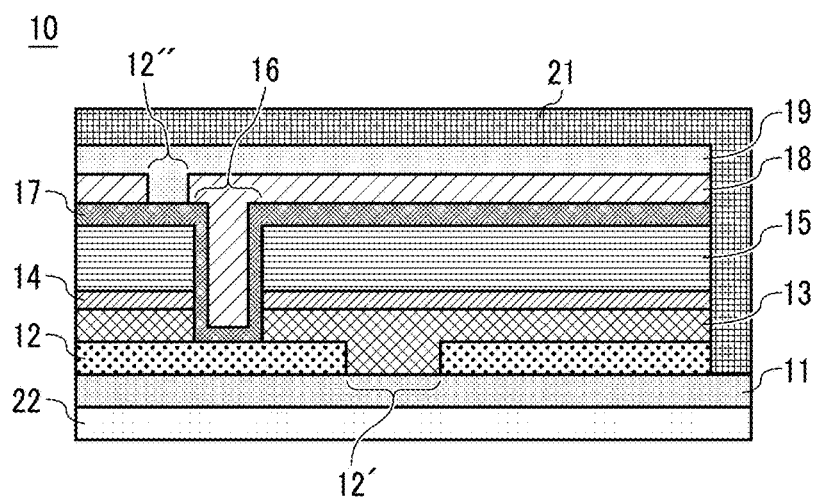
FIG. 4L is a schematic view illustrating one example of a method for producing a photoelectric conversion module.
Figure 4M:
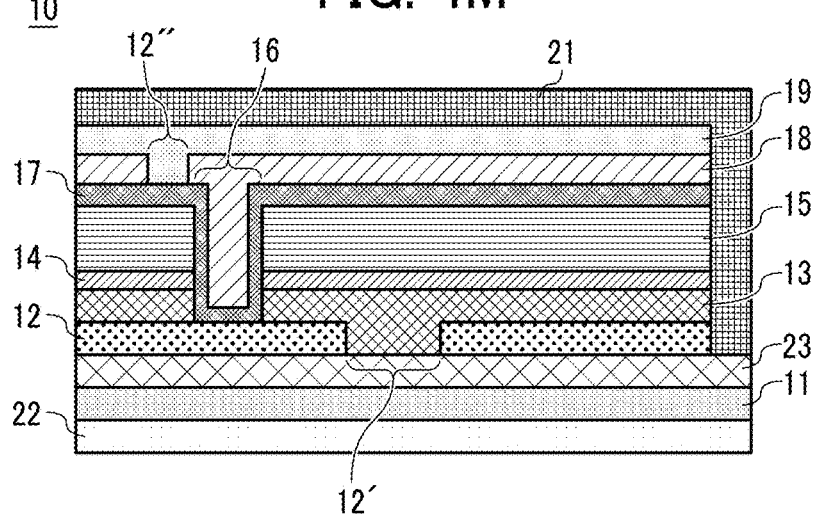
FIG. 4M is a schematic view illustrating one example of a method for producing a photoelectric conversion module.

In the method of the present disclosure for producing the photoelectric conversion element, as illustrated in FIG. 4J and FIG. 4K, after forming a surface protection layer 19 on the second electrode 18, a sealing member 21 may be provided so as to cover the electrodes and the layers on or above the substrate. In the method of the present disclosure for producing the photoelectric conversion element, as illustrated in FIG. 4L, a UV cut layer 22 may be provided on the exposed surface of the substrate 11, and as illustrated in FIG. 4M, a gas barrier layer 23 may be provided between the first electrode 12 and the substrate 11.

<<Electronic Device>>

An electronic device includes the above photoelectric conversion module and a device that is electrically coupled to the photoelectric conversion module. The device that is electrically coupled to the photoelectric conversion module is a device configured to be driven by, for example, electric power generated through photoelectric conversion of the photoelectric conversion module. The electronic device has two or more different embodiments depending on applications thereof. Examples of the embodiments include, but are not limited to, the following first and second embodiments.

The first embodiment is an electronic device including the photoelectric conversion module and the device that is electrically coupled to the photoelectric conversion module; and if necessary, including other devices.

The second embodiment is an electronic device including the photoelectric conversion module, an electricity storage cell that is electrically coupled to the photoelectric conversion module, and a device that is electrically coupled to the photoelectric conversion module and the electricity storage cell; and if necessary, including other devices.

<<Power Supply Module>>

A power supply module includes the above photoelectric conversion module and a power supply integrated circuit (IC) that is electrically coupled to the photoelectric conversion module; and if necessary, includes other devices.

<<Applications>>

The above photoelectric conversion module can function as a self-sustaining power supply and drive a device using electric power generated through photoelectric conversion. Since the photoelectric conversion module can generate electricity by irradiation with light, it is not necessary to couple an electronic device to an external power supply or replace a cell. The electronic device can be driven in a place where there is no power supply facility. The electronic device can be worn or carried. The electronic device can be driven without replacement of a cell even in a place where the cell is difficult to replace. When a dry cell is used in an electronic device, the electronic device becomes heavier by the weight of the dry cell, or the electronic device becomes larger by the size of the dry cell. There may be a problem in installing the electronic device on a wall or ceiling, or carrying the electronic device. However, since the photoelectric conversion module is lightweight and thin, it can be highly freely installed and be worn and carried, which is advantageous.

The photoelectric conversion module can be used as a self-sustaining power supply, and can be incorporated into various electronic devices in use. Examples of applications of the electronic devices that incorporate the photoelectric conversion module include, but are not limited to: display devices, such as electronic desk calculators, watches, mobile phones, electronic organizers, and electronic paper; accessory devices of personal computers, such as mice for personal computers or keyboards for personal computers; various sensor devices, such as temperature and humidity sensors and human detection sensors; transmitters, such as beacons or global positioning systems (GPSs); auxiliary lightings; and remote controllers.

The photoelectric conversion module of the present disclosure can generate electricity even with light of a low illuminance. The low illuminance is, for example, an illuminance as seen in an indoor environment irradiated with, for example, a lighting. Specifically, the low illuminance is an illuminance of 20 lx or higher but 1,000 lx or lower, and is much lower than direct sunlight (about 100,000 lx). The photoelectric conversion module has a wide variety of applications because it can generate electricity even in indoor environments and in further darker shaded areas. The photoelectric conversion module is highly safe because liquid leakage found in the case of a dry cell does not occur, and accidental swallowing found in the case of a button cell does not occur. The photoelectric conversion module can be used as an auxiliary power supply for the purpose of prolonging a continuous operation time of a charge-type or dry cell-type electrical appliance. When the photoelectric conversion module is combined with a device configured to be driven by electric power generated through photoelectric conversion of the photoelectric conversion module, it is possible to obtain an electronic device that is lightweight and easy to use, has a high degree of freedom in installation, does not require replacement, is excellent in safety, and is effective in reducing environmental load. The electronic device that incorporates the photoelectric conversion module can be used for a variety of applications.

Figure 5:
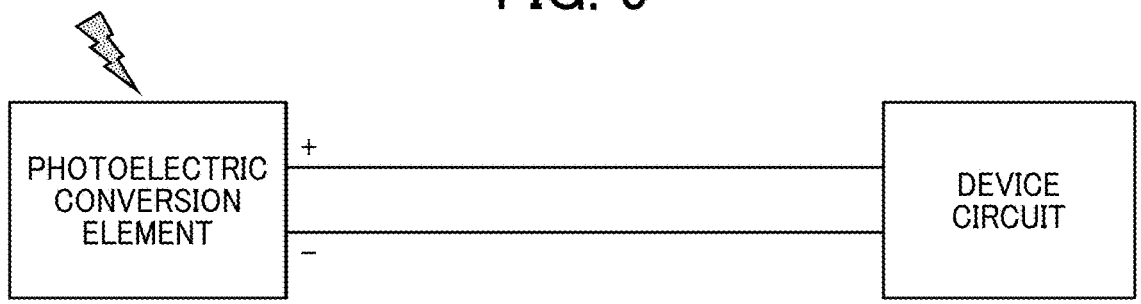
FIG. 5 is a schematic view illustrating one example of a basic configuration of an electronic device.

FIG. 5 is a schematic view illustrating one example of a basic configuration of the electronic device obtained by combining the photoelectric conversion module with the device that is configured to be driven by electric power generated through photoelectric conversion of the photoelectric conversion module. The electronic device can generate electricity when the photoelectric conversion module is irradiated with light, and electric power can be taken out. A circuit of the device can be driven by the generated electric power.

Figure 6:
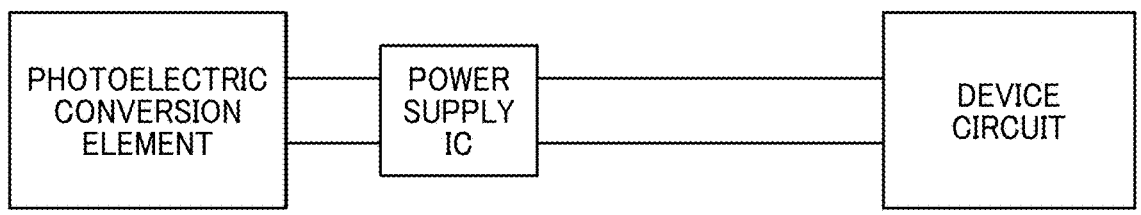
FIG. 6 is a schematic view illustrating one example of a basic configuration of an electronic device.

Since the output of the photoelectric conversion element varies depending on the illuminance of the surroundings, the electronic device illustrated in FIG. 5 cannot sometimes be stably driven. In this case, as illustrated in FIG. 6, which is a schematic view illustrating one example of a basic configuration of the electronic device, a power supply IC is preferably incorporated between the photoelectric conversion module and the circuit of the device to supply stable voltage to a side of the circuit of the device.

Figure 7:
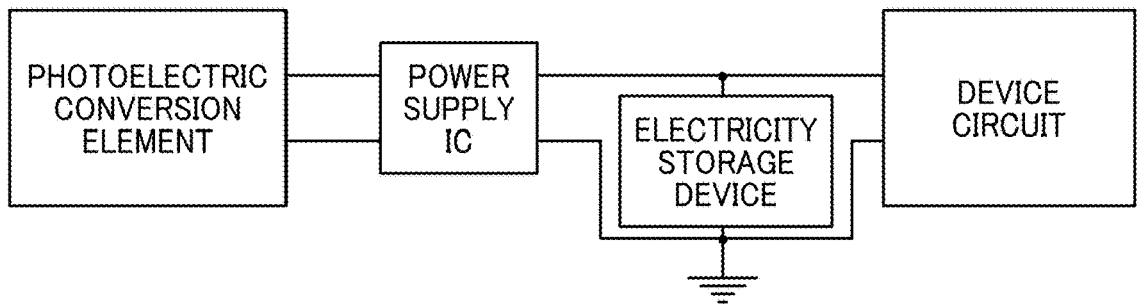
FIG. 7 is a schematic view illustrating one example of a basic configuration of an electronic device.

The photoelectric conversion module can generate electricity as long as the photoelectric conversion module is irradiated with light having a sufficient illuminance. However, when the illuminance is not enough to generate electricity, desired electric power cannot be obtained, which is a disadvantage of the photoelectric conversion module. In this case, as illustrated in FIG. 7, which is a schematic view illustrating one example of a basic configuration of the electronic device, when an electricity storage device such as a capacitor is provided between a power supply IC and a device circuit, excess electric power from the photoelectric conversion module can be charged to the electricity storage device. Even when the illuminance is too low or light is not applied to the photoelectric conversion module, the electric power stored in the electricity storage device can be supplied to a device circuit to allow for stable operation of the device circuit.

The electronic device obtained by combining the photoelectric conversion module with the device circuit can be driven even in an environment without a power supply, does not require replacement of a cell, and can be stably driven, when combined with a power supply IC or an electricity storage device. The electronic device that incorporates the photoelectric conversion module can be used for a variety of applications.

Figure 8:
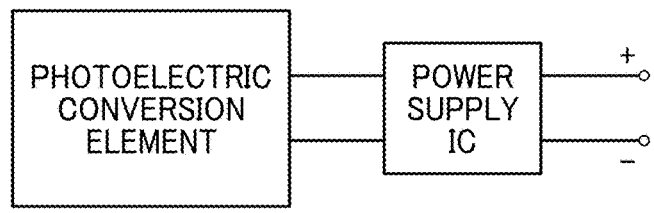
FIG. 8 is a schematic view illustrating one example of a basic configuration of a power supply module.

The photoelectric conversion module can also be used as a power supply module. As illustrated in FIG. 8, which is a schematic view illustrating one example of a basic configuration of a power supply module, for example, when the photoelectric conversion module and a power supply IC are coupled to each other, it is possible to configure a direct current power supply module, which is capable of supplying electric power generated through photoelectric conversion of the photoelectric conversion module to the power supply IC at a predetermined voltage level.

Figure 9:
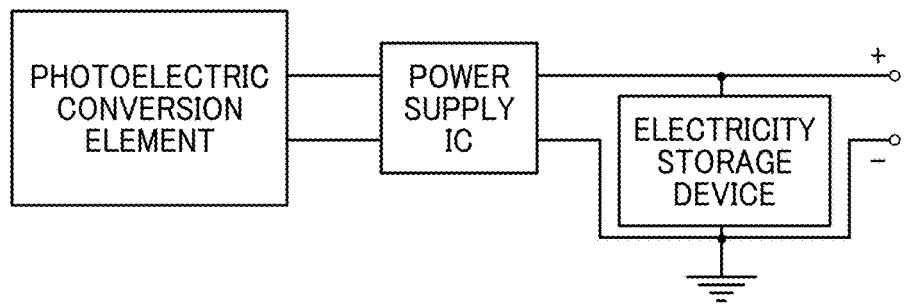
FIG. 9 is a schematic view illustrating one example of a basic configuration of a power supply module.

As illustrated in FIG. 9, which is a schematic view illustrating one example of a basic configuration of a power supply module, when an electricity storage device is added to a power supply IC, electric power generated by the photoelectric conversion element can be charged to the electricity storage device. It is possible to configure a power supply module capable of supplying electric power even when the illuminance is too low or light is not applied to the photoelectric conversion element.

The power supply modules illustrated in FIG. 8 and FIG. 9 can be used as a power supply module without replacement of a cell like in traditional primary cells. The electronic device that incorporates the photoelectric conversion module can be used for a variety of applications.

Now, specific applications of the electronic device including the above photoelectric conversion module and the device configured to be driven by electric power will be described.

<Application as Mouse for Personal Computer>

Figure 10:
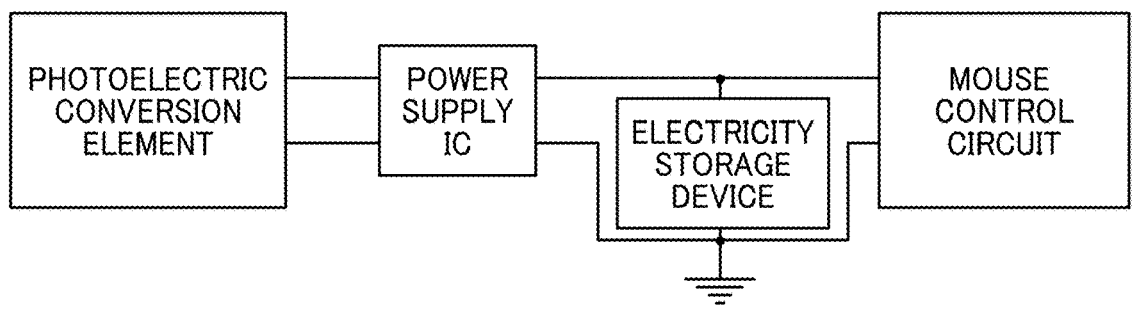
FIG. 10 is a schematic view illustrating one example of a basic configuration of a mouse for a personal computer.

FIG. 10 is a schematic view illustrating one example of a basic configuration of a mouse for a personal computer (hereinafter may also be referred to as a "mouse"). As illustrated in FIG. 10, the mouse includes the photoelectric conversion module, a power supply IC, an electricity storage device, and a mouse control circuit. As a power supply for the mouse control circuit, electric power is supplied from the coupled photoelectric conversion module or electricity storage device. With this configuration, electricity can be charged to the electricity storage device when the mouse is not used, and the mouse can be driven by the charged electric power. The mouse thus obtainable does not require any wiring or replacement of a cell. The mouse can become lightweight because a cell is not required. This is suitable as an application as a mouse.

Figure 11:
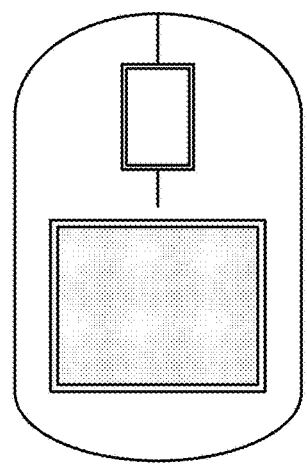
FIG. 11 is a schematic outside view illustrating one example of the mouse for a personal computer illustrated in FIG. 10.

FIG. 11 is a schematic outside view illustrating one example of the mouse for a personal computer illustrated in FIG. 10. As illustrated in FIG. 11, the photoelectric conversion module, the power supply IC, the electricity storage device, and the mouse control circuit are mounted inside the mouse. Meanwhile, the upper part of the photoelectric conversion module is covered with a transparent cover so that light hits the photoelectric conversion module. The whole casing of the mouse can also be shaped from a transparent resin. The arrangement of the photoelectric conversion module is not limited to this. For example, the photoelectric conversion module may be located anywhere as long as light hits the photoelectric conversion module even when the mouse is covered with a hand.

<Application as Keyboard for a Personal Computer>

Figure 12:
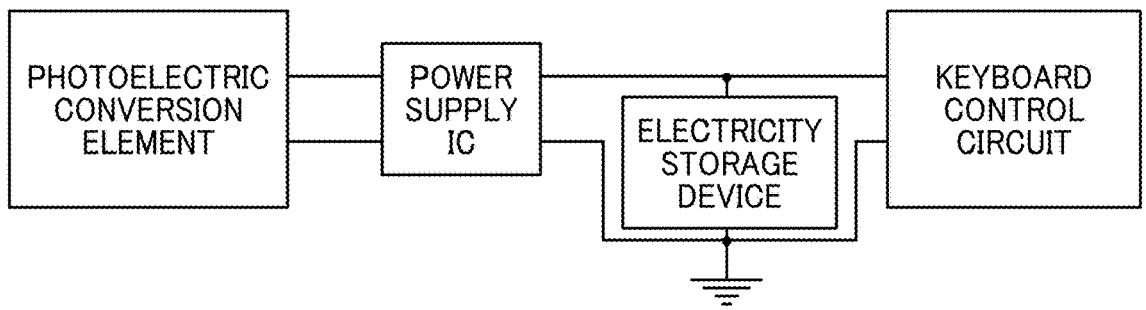
FIG. 12 is a schematic view illustrating one example of a basic configuration of a keyboard for a personal computer.

FIG. 12 is a schematic view illustrating one example of a basic configuration of a keyboard for a personal computer (hereinafter may also be referred to as a "keyboard"). As illustrated in FIG. 12, the keyboard includes the photoelectric conversion module, a power supply IC, an electricity storage device, and a keyboard control circuit. As a power supply for the keyboard control circuit, electric power is supplied from the coupled photoelectric conversion module or electricity storage device. With this configuration, electricity can be charged to the electricity storage device when the keyboard is not used, and the keyboard can be driven by the charged electric power. The keyboard thus obtainable does not require any wiring or replacement of a cell. The keyboard can become lightweight because a cell is not required. This is suitable as an application as a keyboard.

Figure 13:
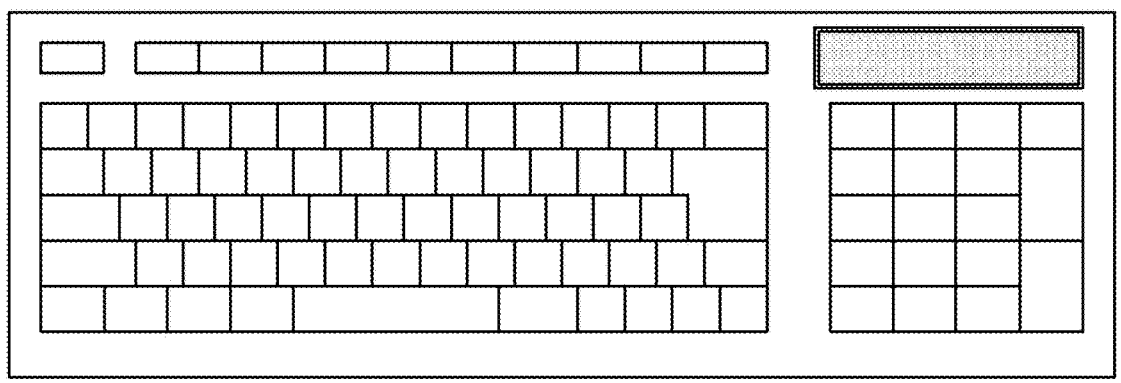
FIG. 13 is a schematic outside view illustrating one example of the keyboard for a personal computer illustrated in FIG. 12.
Figure 14:
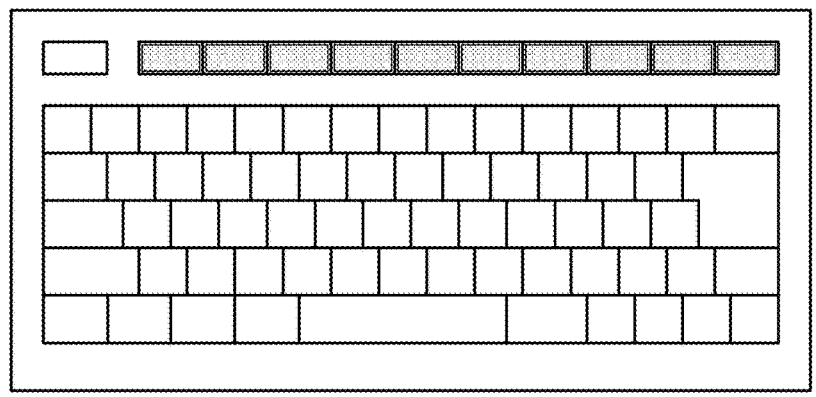
FIG. 14 is a schematic outside view illustrating another example of the keyboard for a personal computer illustrated in FIG. 12.

FIG. 13 is a schematic outside view illustrating one example of the keyboard for a personal computer illustrated in FIG. 12. As illustrated in FIG. 13, the photoelectric conversion module, the power supply IC, the electricity storage device, and the mouse control circuit are mounted inside the keyboard. Meanwhile, the upper part of the photoelectric conversion module is covered with a transparent cover so that light hits the photoelectric conversion module. The whole casing of the keyboard can also be shaped from a transparent resin. The arrangement of the photoelectric conversion module is not limited to this. For example, in the case of a compact keyboard with a small space for the photoelectric conversion module, as illustrated in FIG. 14, which is a schematic outside view illustrating another example of the keyboard for a personal computer illustrated in FIG. 12, a compact photoelectric conversion module can be embedded in parts of the keys.

<Application as Sensor>

Figure 15:
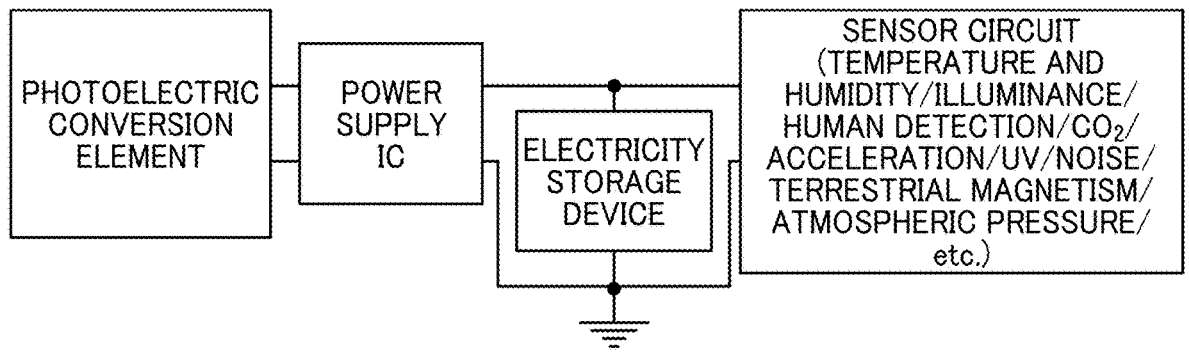
FIG. 15 is a schematic view illustrating one example of a basic configuration of a sensor.
Figure 16:
FIG. 16 is a schematic view illustrating one example of when data obtained through sensing with a sensor is transmitted to a personal computer, a smartphone, etc. via wireless communication.

FIG. 15 is a schematic view illustrating one example of a basic configuration of a sensor as one example of the electronic device. As illustrated in FIG. 15, the sensor includes the photoelectric conversion module, a power supply IC, an electricity storage device, and a sensor circuit. As a power supply for the sensor, electric power is supplied from the coupled photoelectric conversion module or electricity storage device. This makes it possible to configure a sensor that does not require coupling to an external power supply or replacement of a cell. Examples of a sensing target of the sensor include, but are not limited to, temperature and humidity, illuminance, human detection, $CO_2$, acceleration, UV, noise, terrestrial magnetism, and atmospheric pressure. As illustrated in "A" in FIG. 16, the sensor is preferably configured to sense a measurement target on a regular basis and to transmit the read data to, for example, a personal computer (PC) or a smartphone through wireless communication.

It is expected that use of sensors will be significantly increased in response to realization of the internet of things (IoT) society. Replacing cells of numerous sensors one by one takes a lot of effort and is not realistic. Sensors installed at positions where cells are not easy to replace, such as a ceiling and a wall, make workability low. The fact that electricity can be supplied by the photoelectric conversion module is significantly advantageous. The photoelectric conversion module of the present disclosure has such advantages that a high output can be obtained even with light of a low illuminance, and a high degree of freedom in installation can be achieved because dependency of the output on the light incident angle is small.

<Application as Turntable>

Figure 17:
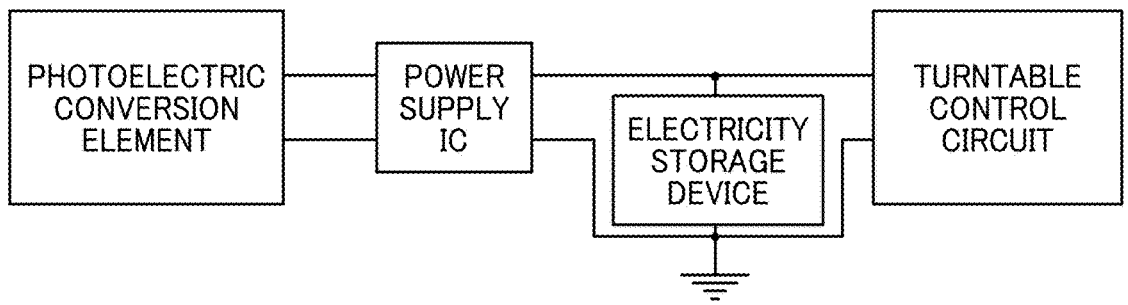
FIG. 17 is a schematic view illustrating one example of a basic configuration of a turntable.

FIG. 17 is a schematic view illustrating one example of a basic configuration of a turntable as one example of the electronic device. As illustrated in FIG. 17, the turntable includes the photoelectric conversion module, a power supply IC, an electricity storage device, and a turntable control circuit. As a power supply for the turntable control circuit, electric power is supplied from the coupled photoelectric conversion module or electricity storage device. This makes it possible to configure a turntable that does not require coupling to an external power supply or replacement of a cell. The turntable is used in, for example, a display case in which products are displayed. Wirings of a power supply degrade appearance of the display. Displayed products need removing when replacing a cell, which takes a lot of effort. The turntable to which electric power can be supplied by the photoelectric conversion module is significantly advantageous.

EXAMPLES

The present disclosure will be described below by way of Examples. However, the present disclosure should not be construed as being limited to the Examples.

Example 1

<Production of Photoelectric Conversion Module>
—Base with First Electrode—
First, a polyethylene terephthalate (PET) substrate (50 mm×50 mm) with a gas barrier film, where a film of indium-doped tin oxide (ITO) was formed through patterning, was procured from GEOMATEC Co., Ltd. As illustrated in FIG. 4C, a first partition portion was formed in the first electrode.

—Formation of First Electron Transporting Layer—

Next, a liquid of zinc oxide nanoparticles (obtained from Aldrich Co., average particle diameter: 12 nm) was spin-coated at 3,000 rpm on the ITO film-formed PET film with a gas barrier film (15 Ω/sq.), followed by drying at 100° C. for 10 minutes, to form an electron transporting layer having an average thickness of 30 nm.

—Formation of Second Electron Transporting Layer (Intermediate Layer)—

Next, dimethylaminobenzoic acid (obtained from Tokyo Chemical Industry Co., Ltd.) was dissolved in ethanol to prepare a 1 mg/ml solution, which was then spin-coated at 3,000 rpm on the first electron transporting layer to form a second electron transporting layer having an average thickness of smaller than 10 nm.

—Formation of Photoelectric Conversion Layer—

The following exemplary compound 1 (number average molecular weight (Mn)=1,554, highest occupied molecular orbital (HOMO) level: 5.13 eV) (15 mg) and the following exemplary compound 3 (10 mg) were dissolved in 1 mL of chloroform to prepare photoelectric conversion layer coating liquid A.

Next, the photoelectric conversion layer coating liquid A was spin-coated at 600 rpm on the intermediate layer, to form a photoelectric conversion layer having an average thickness of 200 nm.

—Formation of Penetrating Portion—

Next, a penetrating portion was formed in a pre-step of forming a coupling portion, which was to couple photoelectric conversion elements in series. The penetrating portion was formed (by deletion) using laser deletion. The shape of the penetrating portion was a rectangle when the plan view of the photoelectric conversion module was observed from a second electrode thereof. When the plan view of the photoelectric conversion module was observed from a second electrode thereof, the distance between the centers of the adjacent penetrating portions was found to be 5.6 mm. When coupling portions were formed in these penetrating portions in a next step, X was 0.12 mm, Y–X was 0.4 mm, and X/(Y–X) was 0.3.

—Formation of Hole Transporting Layer, Second Electrode, and Coupling Portion—

Next, on the photoelectric conversion element and in the penetrating portion, the material of a hole transporting layer;

Exemplary Compound 1

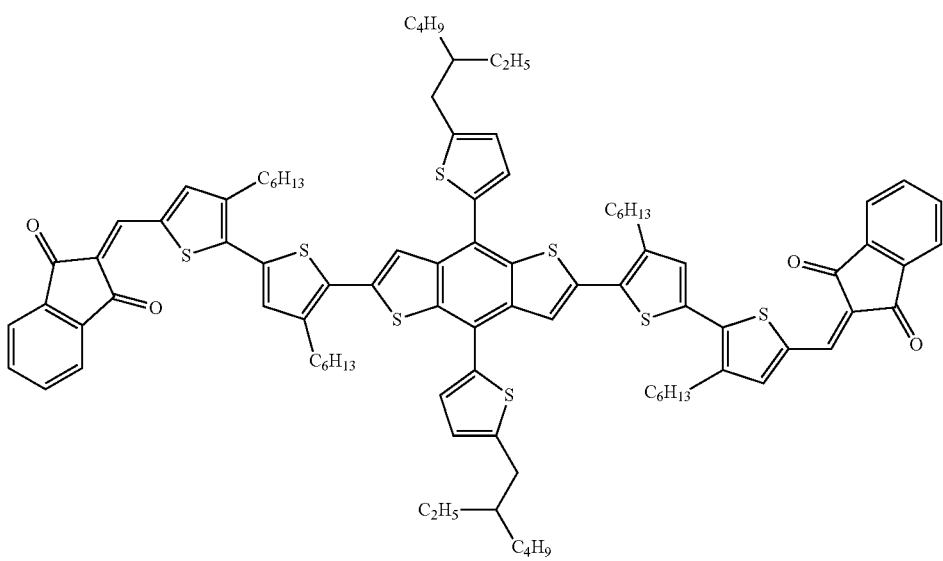

Exemplary Compound 3

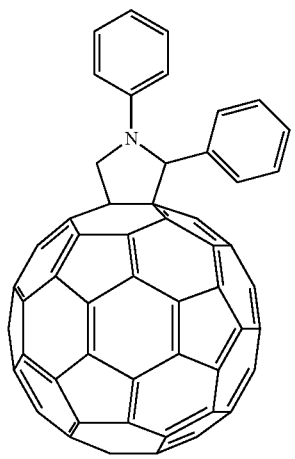

i.e., molybdenum oxide (obtained from Kojundo Chemical Lab. Co., Ltd.) was vapor-deposited in vacuum so as to have an average thickness of 50 nm, and then the material of a second electrode; i.e., silver was vapor-deposited in vacuum so as to have an average thickness of 100 nm, to form a hole transporting layer, a second electrode, and a coupling portion. As illustrated in FIG. 4I, a second partition portion was formed in the second electrode.

—Evaluation of Solar Cell Characteristics—

Each of the photoelectric conversion elements forming the produced photoelectric conversion module was measured for current-voltage characteristics under irradiation with a white LED (color temperature: 5,000 K, illuminance: 200 lx. and 10000 lx.). Specifically, current-voltage measurement was performed between the first electrode in the target element and the first electrode in the adjacent element that was coupled to the target element in series. The obtained current-voltage curve was used to calculate photoelectric conversion efficiency. In the measurement, a bulb-type LED lamp (LDA11N-G/100 W, obtained from Toshiba Lighting & Technology Corporation) was used as the white LED lighting, and KETSIGHT B2902A was used as an evaluation device (source meter). Measurement of the output of the LED light source was made using spectrum color illumination meter C-7000 obtained from SEKONIC COPORATION. A ratio of (200 1x./10,000 lx.) of the photoelectric conversion efficiency at 200 lx. to the photoelectric conversion efficiency at 10,000 lx. was calculated, and results are presented in Table 1.

—Evaluation of Reverse Current Value—

The reverse current value near the coupling portion of the produced photoelectric conversion module was measured using a laser beam induced current (LBIC) measurement device obtained from Bunkoukeiki Co., Ltd. Specifically, a laser light having a light wavelength of 532 nm was used as a light source for evaluation, and a current value observed under conditions of irradiation; i.e., laser output: 2.5 mW and resolution: 100 μm, was measured to determine the reverse current value. With the reverse current value measured when X/(Y-X) was 0.1 being regarded as 1, the relative reverse current value was calculated and evaluated for comparison. Results are presented in Table 1. The reverse current value when X/(Y-X) was 0.1 represents the reverse current value measured in Comparative Example 1.

Example 2

<Production of Photoelectric Conversion Module>

A photoelectric conversion module was produced in the same manner as in the production of the photoelectric conversion module of Example 1, except that X was changed to 0.12 mm, Y-X was changed to 0.2 mm, and X/(Y-X) was changed to 0.6.

Evaluations of solar cell characteristics and reverse current value were performed in the same manner as in Example 1. Results are presented in Table 1.

Example 3

<Production of Photoelectric Conversion Module>

A photoelectric conversion module was produced in the same manner as in the production of the photoelectric conversion module of Example 1, except that X was changed to 0.12 mm, Y-X was changed to 0.12 mm, and X/(Y-X) was changed to 1.0.

Evaluations of solar cell characteristics and reverse current value were performed in the same manner as in Example 1. Results are presented in Table 1.

Example 4

<Production of Photoelectric Conversion Module>

A photoelectric conversion module was produced in the same manner as in the production of the photoelectric conversion module of Example 1, except that the photoelectric conversion layer coating liquid A was changed to the following photoelectric conversion layer coating liquid B.

Evaluations of solar cell characteristics and reverse current value were performed in the same manner as in Example 1. Results are presented in Table 1.

—Photoelectric Conversion Layer Coating Liquid B—

The following exemplary compound 2 (number average molecular weight (Mn)=1,463, highest occupied molecular orbital (HOMO) level: 5.27 eV) (15 mg) and the following exemplary compound 3 (10 mg) were dissolved in 1 mL of chloroform, to prepare photoelectric conversion layer coating liquid B.

Exemplary Compound 2

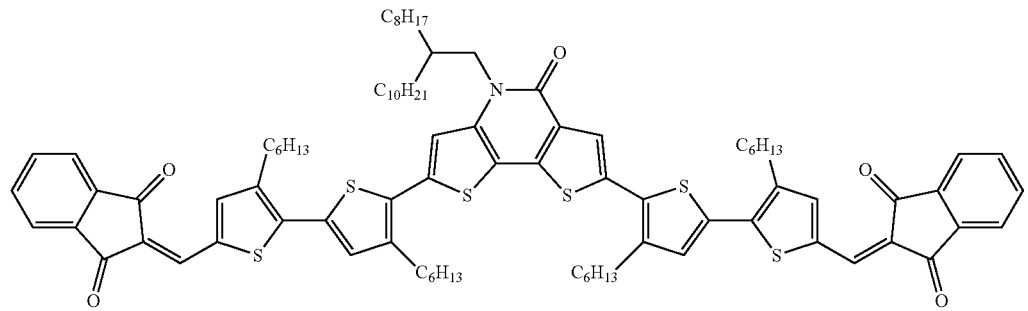

-continued

Exemplary Compound 3

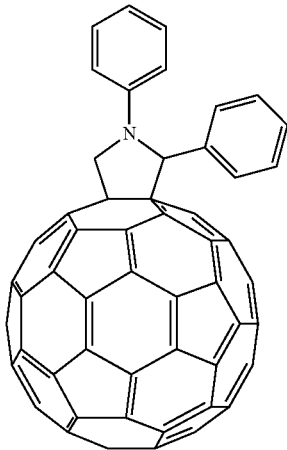

Example 5

<Production of Photoelectric Conversion Module>

A photoelectric conversion module was produced in the same manner as in the production of the photoelectric conversion module of Example 4, except that X was changed to 0.12 mm, Y−X was changed to 0.12 mm, and X/(Y−X) was changed to 1.0.

Evaluations of solar cell characteristics and reverse current value were performed in the same manner as in Example 1. Results are presented in Table 1.

Example 6

<Production of Photoelectric Conversion Module>

A photoelectric conversion module was produced in the same manner as in the production of the photoelectric conversion module of Example 1, except that the photoelectric conversion layer coating liquid A was changed to the following photoelectric conversion layer coating liquid C.

Evaluations of solar cell characteristics and reverse current value were performed in the same manner as in Example 1. Results are presented in Table 1.

—Photoelectric Conversion Layer Coating Liquid C—

The following exemplary compound 4 (number average molecular weight (Mn)=2,029, highest occupied molecular orbital (HOMO) level: 5.50 eV) (15 mg) and the following exemplary compound 3 (10 mg) were dissolved in 1 mL of chloroform, to prepare photoelectric conversion layer coating liquid C.

Exemplary Compound 4

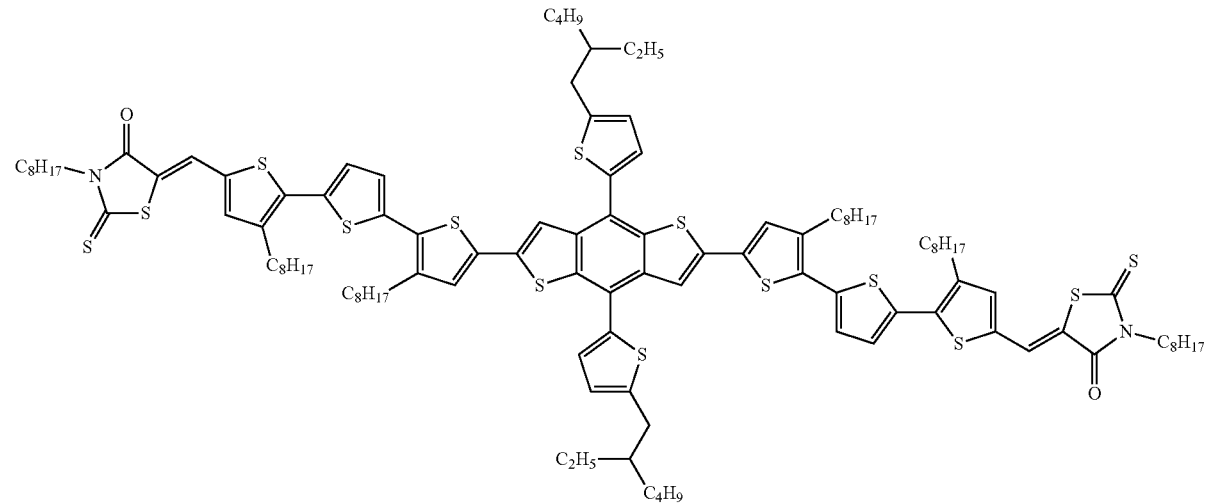

Exemplary Compound 3

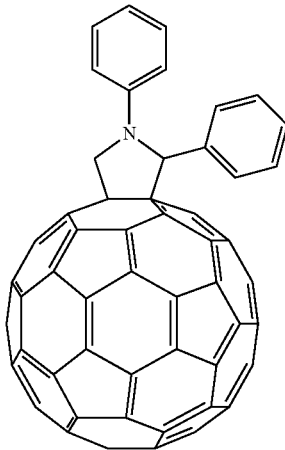

Example 7

<Production of Photoelectric Conversion Module>

A photoelectric conversion module was produced in the same manner as in the production of the photoelectric conversion module of Example 6, except that X was changed to 0.12 mm, Y−X was changed to 0.12 mm, and X/(Y−X) was changed to 1.0.

Evaluations of solar cell characteristics and reverse current value were performed in the same manner as in Example 6. Results are presented in Table 1.

Example 8

<Production of Photoelectric Conversion Module>

A photoelectric conversion module was produced in the same manner as in the production of the photoelectric conversion module of Example 1, except that the photoelectric conversion layer coating liquid A was changed to the following photoelectric conversion layer coating liquid D.

Evaluations of solar cell characteristics and reverse current value were performed in the same manner as in Example 1. Results are presented in Table 1.

—Photoelectric Conversion Layer Coating Liquid D—

The following exemplary compound 1 (number average molecular weight (Mn)=1,554, highest occupied molecular orbital (HOMO) level: 5.13 eV) (15 mg) and PC61BM (E100H, obtained from Frontier Carbon Corporation) (10 mg) were dissolved in 1 mL of chloroform, to prepare photoelectric conversion layer coating liquid D.

Exemplary Compound 1

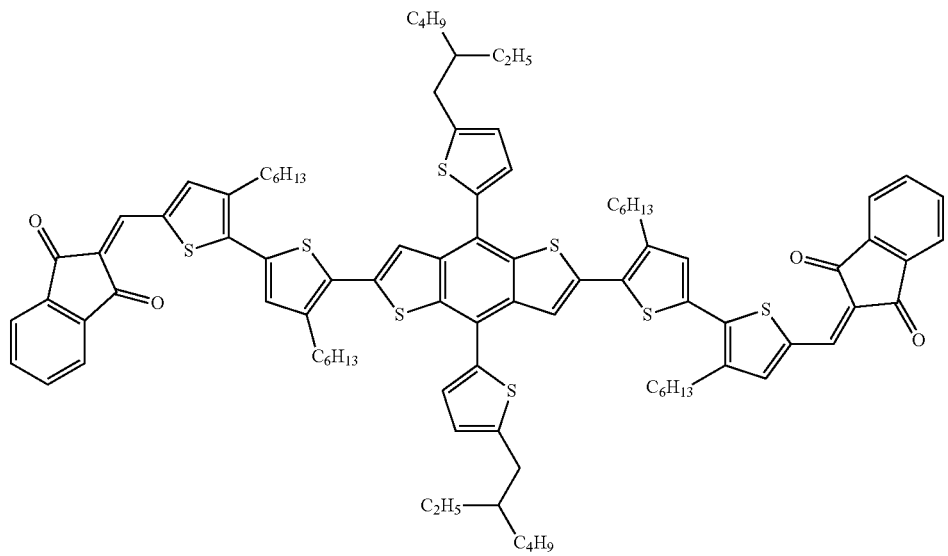

Example 9

<Production of Photoelectric Conversion Module>

A photoelectric conversion module was produced in the same manner as in the production of the photoelectric conversion module of Example 8, except that X was changed to 0.12 mm, Y−X was changed to 0.12 mm, and X/(Y−X) was changed to 1.0.

Evaluations of solar cell characteristics and reverse current value were performed in the same manner as in Example 8. Results are presented in Table 1.

Example 10

<Production of Photoelectric Conversion Module>

A photoelectric conversion module was produced in the same manner as in the production of the photoelectric conversion module of Example 1, except that the photoelectric conversion layer coating liquid A was changed to the following photoelectric conversion layer coating liquid E.

Evaluations of solar cell characteristics and reverse current value were performed in the same manner as in Example 1. Results are presented in Table 1.

—Photoelectric Conversion Layer Coating Liquid E—

The following exemplary compound 1 (number average molecular weight (Mn)=1,554, highest occupied molecular orbital (HOMO) level: 5.13 eV) (14 mg), the following exemplary compound 5 (number average molecular weight (Mn)=15,000, highest occupied molecular orbital (HOMO) level: 5.33 eV) (1 mg), and PC61BM (E100H, obtained from Frontier Carbon Corporation) (10 mg) were dissolved in 1 mL of chloroform, to prepare photoelectric conversion layer coating liquid E.

Exemplary Compound 1

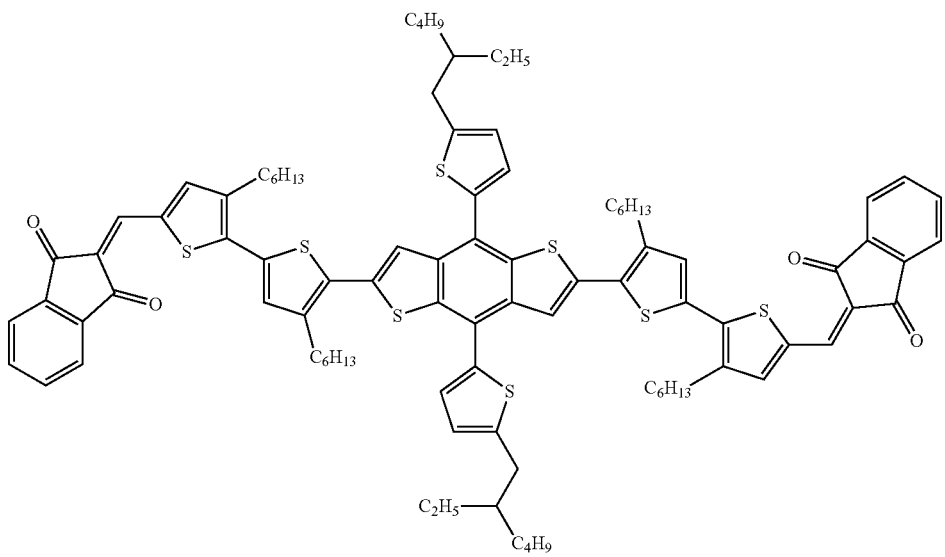

Exemplary Compound 5

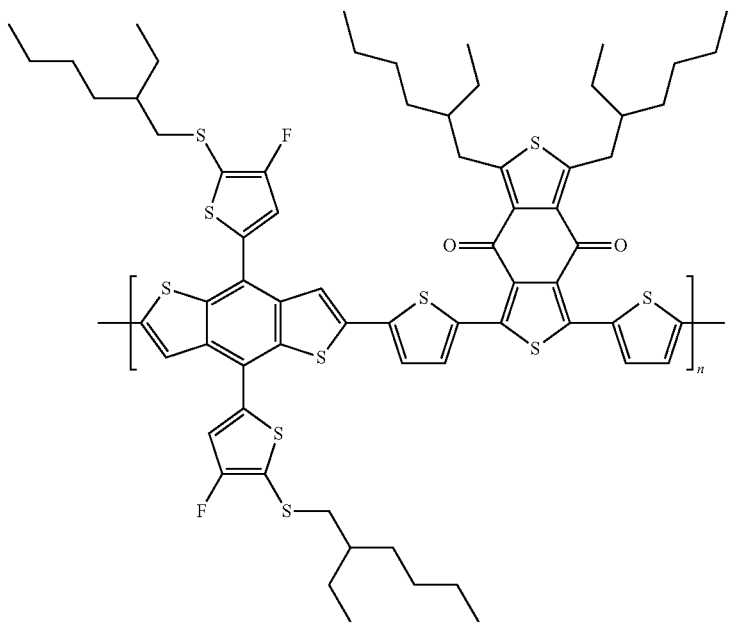

Example 11

<Production of Photoelectric Conversion Module>

A photoelectric conversion module was produced in the same manner as in the production of the photoelectric conversion module of Example 10, except that X was changed to 0.12 mm, Y−X was changed to 0.12 mm, and X/(Y−X) was changed to 1.0.

Evaluations of solar cell characteristics and reverse current value were performed in the same manner as in Example 10. Results are presented in Table 1.

Example 12

<Production of Photoelectric Conversion Module>

A photoelectric conversion module was produced in the same manner as in the production of the photoelectric conversion module of Example 1, except that the photoelectric conversion layer coating liquid A was changed to the following photoelectric conversion layer coating liquid F.

Evaluations of solar cell characteristics and reverse current value were performed in the same manner as in Example 1. Results are presented in Table 1.

—Photoelectric Conversion Layer Coating Liquid F—

The following exemplary compound 1 (number average molecular weight (Mn)=1,554, highest occupied molecular orbital (HOMO) level: 5.13 eV) (14 mg), the following exemplary compound 6 (number average molecular weight (Mn)=15,000, highest occupied molecular orbital (HOMO) level: 5.33 eV) (1 mg), and PC61BM (E100H, obtained from Frontier Carbon Corporation) (10 mg) were dissolved in 1 mL of chloroform, to prepare photoelectric conversion layer coating liquid F.

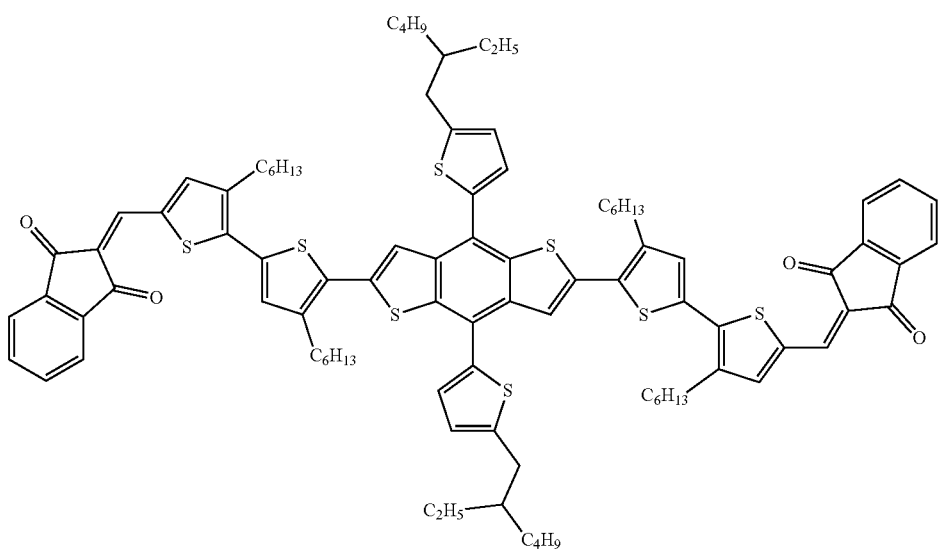

Exemplary Compound 1

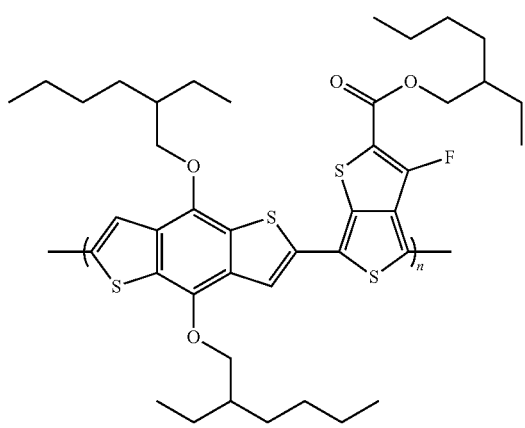

Exemplary Compound 6

Example 13

<Production of Photoelectric Conversion Module>

A photoelectric conversion module was produced in the same manner as in the production of the photoelectric conversion module of Example 12, except that X was changed to 0.12 mm, Y−X was changed to 0.12 mm, and X/(Y−X) was changed to 1.0.

Evaluations of solar cell characteristics and reverse current value were performed in the same manner as in Example 12. Results are presented in Table 1.

Example 14

<Production of Photoelectric Conversion Module>

A photoelectric conversion module was produced in the same manner as in the production of the photoelectric conversion module of Example 1, except that the photoelectric conversion layer coating liquid A was changed to the following photoelectric conversion layer coating liquid G.

Evaluations of solar cell characteristics and reverse current value were performed in the same manner as in Example 1. Results are presented in Table 1.

—Photoelectric Conversion Layer Coating Liquid G—

The following exemplary compound 7 (number average molecular weight (Mn)=1,806, highest occupied molecular orbital (HOMO) level: 5.20 eV) (15 mg) and the following exemplary compound 3 (10 mg) were dissolved in 1 mL of chloroform, to prepare photoelectric conversion layer coating liquid G.

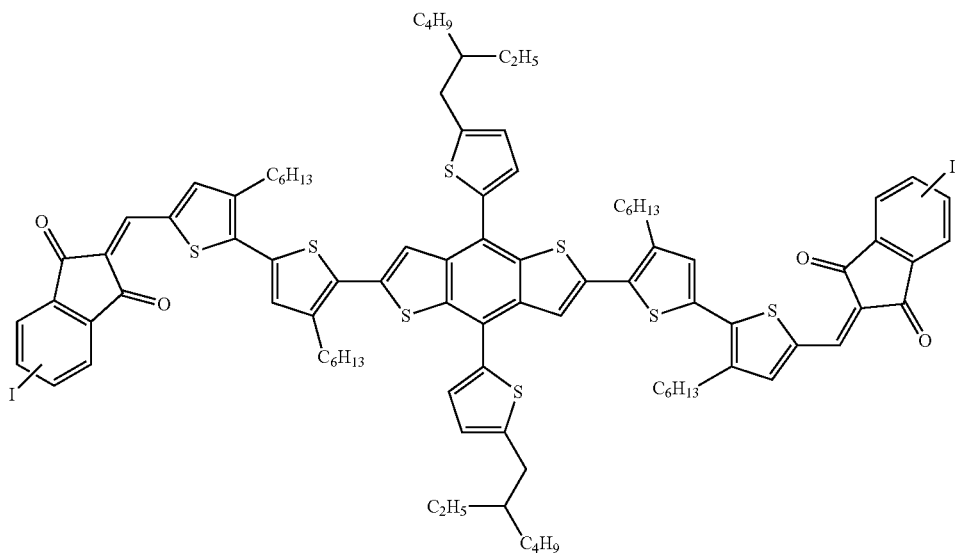

Exemplary Compound 7

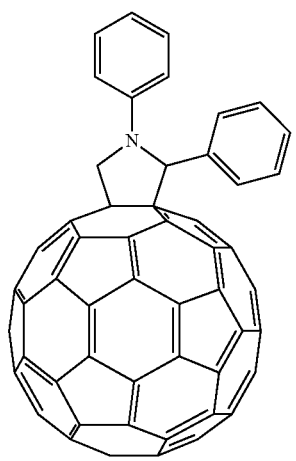

Exemplary Compound 3

Example 15

<Production of Photoelectric Conversion Module>

A photoelectric conversion module was produced in the same manner as in the production of the photoelectric conversion module of Example 14, except that X was changed to 0.12 mm, Y−X was changed to 0.12 mm, and X/(Y−X) was changed to 1.0.

Evaluations of solar cell characteristics and reverse current value were performed in the same manner as in Example 14. Results are presented in Table 1.

Example 16

<Production of Photoelectric Conversion Module>

A photoelectric conversion module was produced in the same manner as in the production of the photoelectric conversion module of Example 1, except that the photoelectric conversion layer coating liquid A was changed to the following photoelectric conversion layer coating liquid H.

Evaluations of solar cell characteristics and reverse current value were performed in the same manner as in Example 1. Results are presented in Table 1.

—Photoelectric Conversion Layer Coating Liquid H—

The following exemplary compound 8 (number average molecular weight (Mn)=1,886, highest occupied molecular orbital (HOMO) level: 5.00 eV) (15 mg) and the following exemplary compound 3 (10 mg) were dissolved in 1 mL of chloroform, to prepare photoelectric conversion layer coating liquid H.

Exemplary Compound 8

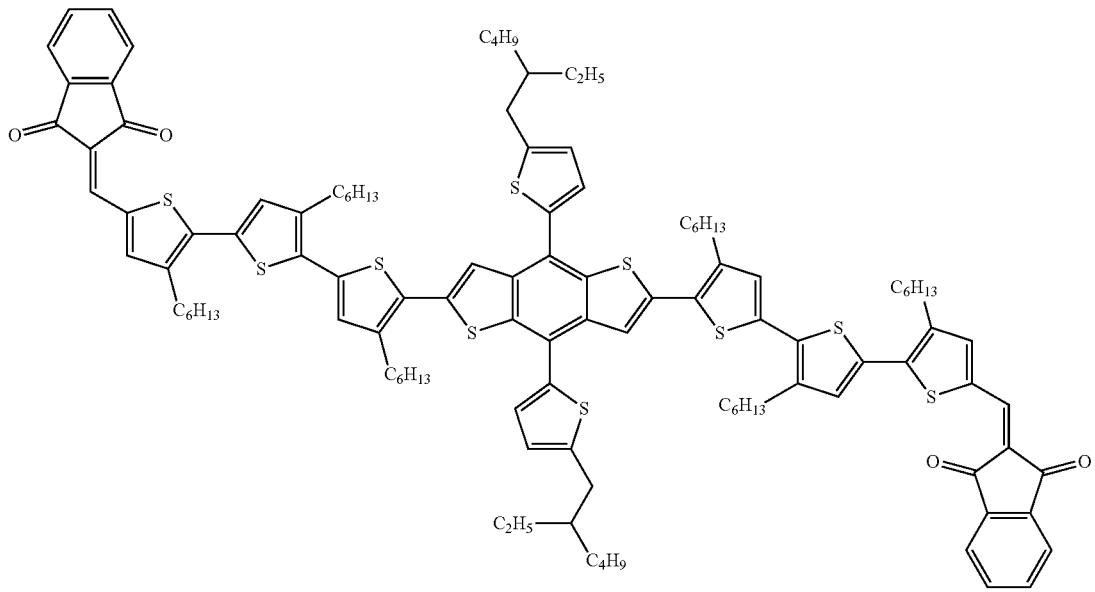

Exemplary Compound 3

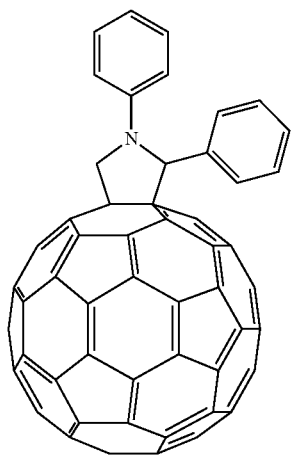

Example 17

<Production of Photoelectric Conversion Module>

A photoelectric conversion module was produced in the same manner as in the production of the photoelectric conversion module of Example 16, except that X was changed to 0.12 mm, Y−X was changed to 0.12 mm, and X/(Y−X) was changed to 1.0.

Evaluations of solar cell characteristics and reverse current value were performed in the same manner as in Example 16. Results are presented in Table 1.

Example 18

<Production of Photoelectric Conversion Module>

A photoelectric conversion module was produced in the same manner as in the production of the photoelectric conversion module of Example 1, except that the photoelectric conversion layer coating liquid A was changed to the following photoelectric conversion layer coating liquid I.

Evaluations of solar cell characteristics and reverse current value were performed in the same manner as in Example 1. Results are presented in Table 1.

—Photoelectric Conversion Layer Coating Liquid I—

P3HT (obtained from Aldrich Co., number average molecular weight (Mn)=54,000, highest occupied molecular orbital (HOMO) level: 5.00 eV) (10 mg) and PC61BM (E100H, obtained from Frontier Carbon Corporation) (10 mg) were dissolved in 1 mL of chloroform, to prepare photoelectric conversion layer coating liquid G.

Example 19

<Production of Photoelectric Conversion Module>

A photoelectric conversion module was produced in the same manner as in the production of the photoelectric conversion module of Example 18, except that X was changed to 0.12 mm, Y−X was changed to 0.12 mm, and X/(Y−X) was changed to 1.0.

Evaluations of solar cell characteristics and reverse current value were performed in the same manner as in Example 18. Results are presented in Table 1.

Example 20

<Production of Photoelectric Conversion Module>

A photoelectric conversion module was produced in the same manner as in the production of the photoelectric conversion module of Example 1, except that the second electron transporting layer (the intermediate layer) was not formed.

Evaluations of solar cell characteristics and reverse current value were performed in the same manner as in Example 1. Results are presented in Table 1.

Example 21

<Production of Photoelectric Conversion Module>

A photoelectric conversion module was produced in the same manner as in the production of the photoelectric conversion module of Example 20, except that X was changed to 0.12 mm, Y−X was changed to 0.12 mm, and X/(Y−X) was changed to 1.0.

Evaluations of solar cell characteristics and reverse current value were performed in the same manner as in Example 20. Results are presented in Table 1.

Example 22

<Production of Photoelectric Conversion Module>

A photoelectric conversion module was produced in the same manner as in the production of the photoelectric conversion module of Example 10, except that X was changed to 0.12 mm, Y−X was changed to 0.01 mm, and X/(Y−X) was changed to 12.0.

Evaluations of solar cell characteristics and reverse current value were performed in the same manner as in Example 10. Results are presented in Table 1.

Example 23

<Production of Photoelectric Conversion Module>

A photoelectric conversion module was produced in the same manner as in the production of the photoelectric conversion module of Example 10, except that X was changed to 0.4 mm, Y−X was changed to 0.01 mm, and X/(Y−X) was changed to 40.0.

Evaluations of solar cell characteristics and reverse current value were performed in the same manner as in Example 10. Results are presented in Table 1.

Example 24

<Production of Photoelectric Conversion Module>

A photoelectric conversion module was produced in the same manner as in the production of the photoelectric conversion module of Example 12, except that X was changed to 0.12 mm, Y−X was changed to 0.01 mm, and X/(Y−X) was changed to 12.0.

Evaluations of solar cell characteristics and reverse current value were performed in the same manner as in Example 12. Results are presented in Table 1.

Example 25

<Production of Photoelectric Conversion Module>

A photoelectric conversion module was produced in the same manner as in the production of the photoelectric conversion module of Example 12, except that X was changed to 0.4 mm, Y−X was changed to 0.01 mm, and X/(Y−X) was changed to 40.0.

Evaluations of solar cell characteristics and reverse current value were performed in the same manner as in Example 12. Results are presented in Table 1.

Comparative Example 1

<Production of Photoelectric Conversion Module>

A photoelectric conversion module was produced in the same manner as in the production of the photoelectric conversion module of Example 1, except that X was changed to 0.05 mm, Y−X was changed to 0.5 mm, and X/(Y−X) was changed to 0.1.

Evaluations of solar cell characteristics and reverse current value were performed in the same manner as in Example 1. Results are presented in Table 2.

Comparative Example 2

<Production of Photoelectric Conversion Module>

A photoelectric conversion module was produced in the same manner as in the production of the photoelectric conversion module of Example 1, except that X was changed to 0.1 mm, Y–X was changed to 0.5 mm, and X/(Y–X) was changed to 0.2.

Evaluations of solar cell characteristics and reverse current value were performed in the same manner as in Example 1. Results are presented in Table 2.

Comparative Example 3

<Production of Photoelectric Conversion Module>

A photoelectric conversion module was produced in the same manner as in the production of the photoelectric conversion module of Example 1, except that the penetrating portion was not formed (in other words, the coupling portion was not formed).

Evaluations of solar cell characteristics and reverse current value were performed in the same manner as in Example 1. Results are presented in Table 2.

Comparative Example 4

<Production of Photoelectric Conversion Module>

A photoelectric conversion module was produced in the same manner as in the production of the photoelectric conversion module of Example 1, except that the first partition portion and the second partition portion were not formed and the penetrating portion was not formed (in other words, the coupling portion was not formed).

Evaluations of solar cell characteristics and reverse current value were performed in the same manner as in Example 1. Results are presented in Table 2.

Comparative Example 5

<Production of Photoelectric Conversion Module>

A photoelectric conversion module was produced in the same manner as in the production of the photoelectric conversion module of Example 4, except that X was changed to 0.1 mm, Y–X was changed to 0.5 mm, and X/(Y–X) was changed to 0.2.

Evaluations of solar cell characteristics and reverse current value were performed in the same manner as in Example 4. Results are presented in Table 2.

Comparative Example 6

<Production of Photoelectric Conversion Module>

A photoelectric conversion module was produced in the same manner as in the production of the photoelectric conversion module of Example 6, except that X was changed to 0.1 mm, Y–X was changed to 0.5 mm, and X/(Y–X) was changed to 0.2.

Evaluations of solar cell characteristics and reverse current value were performed in the same manner as in Example 6. Results are presented in Table 2.

Comparative Example 7

<Production of Photoelectric Conversion Module>

A photoelectric conversion module was produced in the same manner as in the production of the photoelectric conversion module of Example 8, except that X was changed to 0.1 mm, Y–X was changed to 0.5 mm, and X/(Y–X) was changed to 0.2.

Evaluations of solar cell characteristics and reverse current value were performed in the same manner as in Example 8. Results are presented in Table 2.

Comparative Example 8

<Production of Photoelectric Conversion Module>

A photoelectric conversion module was produced in the same manner as in the production of the photoelectric conversion module of Example 10, except that X was changed to 0.1 mm, Y–X was changed to 0.5 mm, and X/(Y–X) was changed to 0.2.

Evaluations of solar cell characteristics and reverse current value were performed in the same manner as in Example 10. Results are presented in Table 2.

Comparative Example 9

<Production of Photoelectric Conversion Module>

A photoelectric conversion module was produced in the same manner as in the production of the photoelectric conversion module of Example 12, except that X was changed to 0.1 mm, Y–X was changed to 0.5 mm, and X/(Y–X) was changed to 0.2.

Evaluations of solar cell characteristics and reverse current value were performed in the same manner as in Example 12. Results are presented in Table 2.

Comparative Example 10

<Production of Photoelectric Conversion Module>

A photoelectric conversion module was produced in the same manner as in the production of the photoelectric conversion module of Example 14, except that X was changed to 0.1 mm, Y–X was changed to 0.5 mm, and X/(Y–X) was changed to 0.2.

Evaluations of solar cell characteristics and reverse current value were performed in the same manner as in Example 14. Results are presented in Table 2.

Comparative Example 11

<Production of Photoelectric Conversion Module>

A photoelectric conversion module was produced in the same manner as in the production of the photoelectric conversion module of Example 16, except that X was changed to 0.1 mm, Y–X was changed to 0.5 mm, and X/(Y–X) was changed to 0.2.

Evaluations of solar cell characteristics and reverse current value were performed in the same manner as in Example 16. Results are presented in Table 2.

Comparative Example 12

<Production of Photoelectric Conversion Module>

A photoelectric conversion module was produced in the same manner as in the production of the photoelectric conversion module of Example 18, except that X was changed to 0.1 mm, Y–X was changed to 0.5 mm, and X/(Y–X) was changed to 0.2.

Evaluations of solar cell characteristics and reverse current value were performed in the same manner as in Example 18. Results are presented in Table 2.

Comparative Example 13

<Production of Photoelectric Conversion Module>

A photoelectric conversion module was produced in the same manner as in the production of the photoelectric conversion module of Example 20, except that X was changed to 0.1 mm, Y−X was changed to 0.5 mm, and X/(Y−X) was changed to 0.2.

Evaluations of solar cell characteristics and reverse current value were performed in the same manner as in Example 20. Results are presented in Table 2.

TABLE 1

|  |  | Ratio of photoelectric conversion efficiencies (200 lx./10 klx.) | Relative reverse current value (Illuminance: 200 lx.) |
|---|---|---|---|
| Ex. | 1 | 0.90 | 0.70 |
|  | 2 | 0.92 | 0.65 |
|  | 3 | 0.91 | 0.62 |
|  | 4 | 0.96 | 0.67 |
|  | 5 | 0.96 | 0.62 |
|  | 6 | 0.96 | 0.68 |
|  | 7 | 0.96 | 0.64 |
|  | 8 | 1.00 | 0.72 |
|  | 9 | 0.99 | 0.70 |
|  | 10 | 0.92 | 0.69 |
|  | 11 | 0.90 | 0.62 |
|  | 12 | 0.94 | 0.70 |
|  | 13 | 0.91 | 0.69 |
|  | 14 | 0.92 | 0.70 |
|  | 15 | 0.92 | 0.67 |
|  | 16 | 0.91 | 0.71 |
|  | 17 | 0.90 | 0.63 |
|  | 18 | 0.91 | 0.71 |
|  | 19 | 0.91 | 0.66 |
|  | 20 | 0.98 | 0.69 |
|  | 21 | 0.91 | 0.65 |
|  | 22 | 0.90 | 0.29 |
|  | 23 | 0.90 | 0.28 |
|  | 24 | 0.89 | 0.24 |
|  | 25 | 0.88 | 0.24 |

TABLE 2

|  |  | Ratio of photoelectric conversion efficiencies (200 lx./10 klx.) | Relative reverse current value (Illuminance: 200 lx.) |
|---|---|---|---|
| Comp. Ex. | 1 | 0.73 | 1.00 |
|  | 2 | 0.74 | 0.95 |
|  | 3 | Not function as a module |  |
|  | 4 | Not function as a module |  |
|  | 5 | 0.72 | 0.94 |
|  | 6 | 0.68 | 0.94 |
|  | 7 | 0.70 | 0.93 |
|  | 8 | 0.68 | 0.95 |
|  | 9 | 0.70 | 0.95 |
|  | 10 | 0.68 | 0.96 |
|  | 11 | 0.68 | 0.95 |
|  | 12 | 0.67 | 0.92 |
|  | 13 | 0.54 | 0.93 |

From the results of Table 1 and Table 2, it is found that the photoelectric conversion module of the present disclosure, where X/(Y−X) is 0.3 or greater, has suppressed generation of reverse current and improved photoelectric conversion efficiency in the photoelectric conversion module, which makes it possible to make small the difference in photoelectric conversion efficiency between in low-illuminance environments and in high-illuminance environments.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. A photoelectric conversion module comprising
   a plurality of photoelectric conversion elements that are electrically coupled to each other, where each of the photoelectric conversion elements sequentially includes a first electrode, a photoelectric conversion layer, and a second electrode,
   the plurality of photoelectric conversion elements including a first photoelectric conversion element and a second photoelectric conversion element;
   a coupling portion configured to couple the first photoelectric conversion element and the second photoelectric conversion element in series;
   a first partition portion between the first electrode forming the first photoelectric conversion element and the first electrode forming the second photoelectric conversion element; and
   a second partition portion between the second electrode forming the first photoelectric conversion element and the second electrode forming the second photoelectric conversion element,
   wherein the first electrode or the second electrode forming the first photoelectric conversion element includes a contact region which is in contact with the coupling portion,
   wherein a value of X/(Y−X) is 0.3 or greater, where X denotes a length of the contact region in a coupling direction in which the first photoelectric conversion element and the second photoelectric conversion element are coupled to each other, and Y denotes a length in the coupling direction between an end of the first partition portion at a side of the second partition portion and an end of the second partition portion at a side of the first partition portion.

2. The photoelectric conversion module according to claim 1, wherein each of the photoelectric conversion elements sequentially includes the first electrode, an electron transporting layer, the photoelectric conversion layer, a hole transporting layer, and the second electrode.

3. The photoelectric conversion module according to claim 2, wherein the coupling portion has a penetrating structure that penetrates at least the photoelectric conversion layer in a stacking direction, and
   when the contact region is located at the first electrode in the first photoelectric conversion element, the coupling portion includes a material of the hole transporting layer and a material of the second electrode, and
   when the contact region is located at the second electrode in the first photoelectric conversion element, the coupling portion includes a material of the electron transporting layer and a material of the first electrode.

4. The photoelectric conversion module according to claim 3, wherein when the contact region is located at the first electrode in the first photoelectric conversion element, the first electrode in the first photoelectric conversion element is in contact with a portion containing the material of the hole transporting layer in the coupling portion, and
   when the contact region is located at the second electrode in the first photoelectric conversion element, the second electrode in the first photoelectric conversion element is in contact with a portion containing the material of the electron transporting layer in the coupling portion.

5. The photoelectric conversion module according to claim 1, wherein the photoelectric conversion layer includes an organic material having a highest occupied molecular orbital (HOMO) level of 5.1 eV or higher but 5.5 eV or lower and a number average molecular weight (Mn) of 10,000 or lower.

6. The photoelectric conversion module according to claim 5, wherein the photoelectric conversion layer includes a compound represented by General Formula (1) below:

General Formula (1)

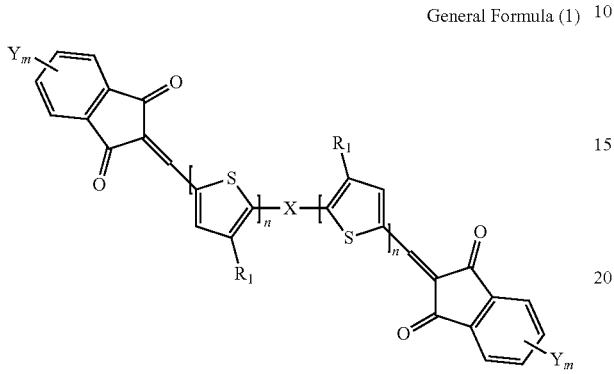

where in the General Formula (1), $R_1$ represents an alkyl group having carbon atoms of 2 or more but 8 or less, n represents an integer of 1 or greater but 3 or smaller, X represents General Formula (2) below or General Formula (3) below, Y represents a halogen atom, and m represents an integer of 0 or greater but 4 or smaller, General Formula (2)

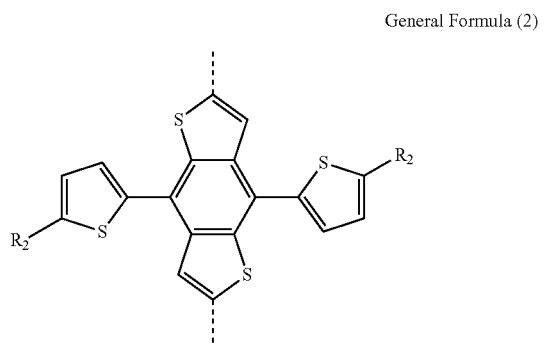

where in the General Formula (2), $R_2$ represents a straight-chain or branched alkyl group, General Formula (3)

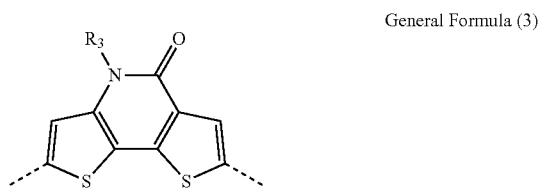

where in the General Formula (3), $R_3$ represents a straight-chain or branched alkyl group.

7. The photoelectric conversion module according to claim 1, wherein the photoelectric conversion layer includes an organic material that is a fullerene derivative.

8. The photoelectric conversion module according to claim 2, wherein the electron transporting layer includes:
a first electron transporting layer; and
a second electron transporting layer between the first electron transporting layer and the photoelectric conversion layer,
wherein the first electron transporting layer includes particles of a metal oxide, and
wherein the second electron transporting layer includes an amine compound represented by General Formula (4) below:

General Formula (4)

where in the General Formula (4), $R_4$ and $R_5$ independently represent an alkyl group which may have a substituent and includes carbon atoms of 1 or more but 4 or less, or represent a ring structure where $R_4$ and $R_5$ are bonded to each other, X represents a divalent aromatic group having carbon atoms of 6 or more but 14 or less or an alkyl group having carbon atoms of 1 or more but 4 or less, and A represents a substituent of Structural Formula (1), (2), or (3) below:

—COOH    Structural Formula (1),

—P(=O)(OH)$_2$    Structural Formula (2),

—Si(OH)$_3$    Structural Formula (3).

9. The photoelectric conversion module according to claim 2, wherein the photoelectric conversion layer includes an organic material having a highest occupied molecular orbital (HOMO) level of 5.1 eV or higher but 5.5 eV or lower and a number average molecular weight (Mn) of 10,000 or lower, and an organic material having a highest occupied molecular orbital (HOMO) level of 5.2 eV or higher but 5.6 eV or lower and a number average molecular weight (Mn) of 10,000 or higher.

10. An electronic device comprising:
the photoelectric conversion module according to claim 1; and
a device that is electrically coupled to the photoelectric conversion module.

11. An electronic device comprising:
the photoelectric conversion module according to claim 1;
an electricity storage cell that is electrically coupled to the photoelectric conversion module; and
a device that is electrically coupled to the photoelectric conversion module and the electricity storage cell.

12. A power supply module comprising:
the photoelectric conversion module according to claim 1; and
a power supply IC that is electrically coupled to the photoelectric conversion module.

* * * * *